(12) United States Patent
Ishikawa et al.

(10) Patent No.: US 10,184,847 B2
(45) Date of Patent: Jan. 22, 2019

(54) MAGNETOSTRICTIVE SENSOR, MAGNETIC STRUCTURE AND PRODUCTION METHOD THEREOF, MOTOR DRIVE DEVICE PROVIDED WITH MAGNETOSTRICTIVE SENSOR, AND MOTOR ASSISTED BICYCLE

(71) Applicant: YAMAHA HATSUDOKI KABUSHIKI KAISHA, Iwata-shi, Shizuoka (JP)

(72) Inventors: Satomi Ishikawa, Iwata (JP); Hiroshi Matsumoto, Iwata (JP)

(73) Assignee: YAMAHA HATSUDOKI KABUSHIKI KAISHA, Iwata-Shi, Shizuoka (JP)

( * ) Notice: Subject to any disclaimer, the term of this patent is extended or adjusted under 35 U.S.C. 154(b) by 0 days.

(21) Appl. No.: 15/853,119

(22) Filed: Dec. 22, 2017

(65) Prior Publication Data
US 2018/0120177 A1  May 3, 2018

Related U.S. Application Data

(63) Continuation-in-part of application No. PCT/JP2016/068719, filed on Jun. 23, 2016.

(30) Foreign Application Priority Data

Jun. 23, 2015 (JP) ................. 2015-125842
Jun. 23, 2015 (JP) ................. 2015-125843

(51) Int. Cl.
  *G01L 3/10* (2006.01)
  *B62M 6/50* (2010.01)
  *H01L 41/12* (2006.01)

(52) U.S. Cl.
  CPC ............. *G01L 3/102* (2013.01); *B62M 6/50* (2013.01); *G01L 3/103* (2013.01); *G01L 3/105* (2013.01); *H01L 41/125* (2013.01)

(58) Field of Classification Search
  CPC ......... G01L 3/101; G01L 3/102; G01L 3/104; G01L 3/105; B62M 6/50; H01L 41/125
  (Continued)

(56) References Cited

U.S. PATENT DOCUMENTS 4,823,620 A * 4/1989 Edo .................... G01L 3/102
                                                 73/862.334
5,201,964 A    4/1993 Savage et al.
(Continued)

FOREIGN PATENT DOCUMENTS

EP    0404569 A2   12/1990
EP    1626260 A1    2/2006
(Continued)

OTHER PUBLICATIONS

Chikazumi, Soshin et al., Handbook of Magnetic Material, Asakura Publishing Co., Ltd., New Edition, Apr. 1, 2006, pp. 1082-1083.
(Continued)

*Primary Examiner* — Jonathan Dunlap
*Assistant Examiner* — Octavia Hollington
(74) *Attorney, Agent, or Firm* — Rabin & Berdo, P.C.

(57) ABSTRACT

A magnetostrictive sensor, including a tubular or columnar substrate extending along an axis, and a magnetostrictive portion disposed on an outer peripheral surface of the substrate and including a plurality of magnetostrictive lines. The plurality of magnetostrictive lines include adjacent first and second magnetostrictive lines that extend along an extension direction, and that are disposed on the outer peripheral surface of the substrate via respectively first and second contact areas. In a cross sectional view of the magnetostrictive portion taken orthogonally to the extension direction, a first length, which is a width of a widest portion of the first magnetostrictive line in a width direction parallel to the outer peripheral surface of the substrate, is larger than
(Continued)

a width of the first contact area in the width direction, and than a shortest distance between the first and second contact areas in the width direction.

13 Claims, 25 Drawing Sheets

(58) Field of Classification Search
    USPC .................. 73/862.331–862.338, 862.325
    See application file for complete search history.

(56) References Cited

U.S. PATENT DOCUMENTS

| | | | |
|---|---|---|---|
| 5,280,729 | A | 1/1994 | Aoki et al. |
| 5,313,845 | A | 5/1994 | Hayashi et al. |
| 5,321,985 | A * | 6/1994 | Kashiwagi ............. G01L 3/102 324/209 |
| 5,353,649 | A * | 10/1994 | Hase ..................... G01L 3/102 73/862.333 |
| 5,585,574 | A | 12/1996 | Sugihara et al. |
| 7,564,152 | B1 | 7/2009 | Clark et al. |
| 2007/0022809 | A1 | 2/2007 | Yoshida et al. |
| 2007/0068280 | A1 | 3/2007 | Cripe |

FOREIGN PATENT DOCUMENTS

| | | |
|---|---|---|
| JP | S60-254679 A | 12/1985 |
| JP | H03-002638 A | 1/1991 |
| JP | H03-054429 A | 3/1991 |
| JP | H04-329325 A | 11/1992 |
| JP | H05-072064 A | 3/1993 |
| JP | H06-241923 A | 9/1994 |
| JP | H06-291384 A | 10/1994 |
| JP | H09-008378 A | 1/1997 |
| JP | 2004-184189 A | 7/2004 |
| JP | 2004-264188 A | 9/2004 |
| JP | 2004-340783 A | 12/2004 |
| JP | 2007-093244 A | 4/2007 |
| JP | 4936969 B2 | 5/2012 |

OTHER PUBLICATIONS

Richard M. Bozorth, Ferromagnetism, 1993, Editorial Board Institute of Electrical and Electronics Engineers, pp. 197, 664 (1993).

* cited by examiner

MAGNETOSTRICTIVE SENSOR, MAGNETIC STRUCTURE AND PRODUCTION METHOD THEREOF, MOTOR DRIVE DEVICE PROVIDED WITH MAGNETOSTRICTIVE SENSOR, AND MOTOR ASSISTED BICYCLE

CROSS-REFERENCES TO RELATED APPLICATIONS

The present application is a continuation-in-part application of International Application No. PCT/JP2016/068719, filed on Jun. 23, 2016, and having the benefit of the earlier filing dates of Japanese Application No. 2015-125842, filed on Jun. 23, 2015 and Japanese Application No. 2015-125843, filed on Jun. 23, 2015. The content of each of the identified applications is incorporated herein by reference in its entirety.

TECHNICAL FIELD

The present invention relates to a magnetostrictive sensor, a magnetic structure, a method for fabricating the magnetic structure, a motor-driven device including the magnetostrictive sensor, and an electric motor-assisted bicycle including the magnetostrictive sensor.

BACKGROUND ART

A magnetostrictive sensor is typically used for detecting a torque or a load. In many magnetostrictive sensors, a magnetostrictive portion containing a magnetostrictive material is formed on an outer peripheral surface of a member (substrate) on which a torque or a load acts. In a magnetostrictive sensor having such a structure, a coil is disposed to surround the substrate on which the magnetostrictive portion is formed.

The above-described structure of the magnetostrictive sensor causes a magnetic permeability of the magnetostrictive material of the magnetostrictive portion to change when a force acts on the substrate on which the magnetostrictive portion is formed. Accordingly, the impedance of the coil disposed to surround the magnetostrictive portion changes. The magnetostrictive sensor detects the change in the impedance of the coil, thereby detecting a torque or a load.

Patent Document 1 discloses a torque sensor using a magnetostrictive material made of a Fe—Ni binary alloy. A structure disclosed in this document is intended to increase sensor sensitivity by determining the composition of Fe—Ni in such a manner that a preferable relative permeability and a preferable magnetostriction constant are obtained.

Patent Document 2 discloses a method for forming a magnetostrictive portion on a substrate. In this method, the substrate is immersed in a plating solution with a predetermined portion of the substrate being masked with a masking member. Thereafter, a current is caused to flow in the plating solution so that a plating film (magnetostrictive portion) is formed on an unmasked portion of the substrate. The magnetostrictive portion disclosed in Patent Document 2 includes a plurality of parallel lines (magnetostrictive lines).

CITATION LIST

Patent Document

Patent Document 1: Japanese Patent Application Publication No. 2007-93244
Patent Document 2: Japanese Patent No. 4936969

SUMMARY OF INVENTION

As described in the structure of Patent Document 1, accurate detection of a torque or a load requires increased sensitivity of a magnetostrictive sensor.

In a structure in which a magnetostrictive sensor includes a plurality of parallel magnetostrictive lines in a manner similar to the structure disclosed in Patent Document 2 described above, it is conceivable to increase the number of magnetostrictive lines in order to increase sensitivity of the magnetostrictive sensor.

In the magnetostrictive portion formed in a limited area on the substrate, however, an increase in the number of magnetostrictive lines has a limitation because of dimensional constraints.

In view of the circumstances described above, the present invention provides a magnetostrictive sensor that includes a magnetostrictive portion having a plurality of magnetostrictive lines and is configured to obtain increased sensitivity even under dimensional constraints on the magnetostrictive portion.

To increase sensitivity of the magnetostrictive sensor, a change in magnetic permeability occurring in the magnetostrictive portion needs to be more easily detected using the coil. In view of this, it may be effective to increase the number of magnetostrictive lines in order to facilitate the detection of the change in magnetic permeability. However, there is a limitation on the number of magnetostrictive lines that can be formed in the magnetostrictive portion formed on a limited area.

On the other hand, through an intensive study, inventors found that advantages similar to those obtained by increasing the number of magnetostrictive lines can be obtained by increasing the surface area of the magnetostrictive portion. That is, the magnetic permeability of the magnetostrictive portion can be changed in a wide range by increasing the surface area of the magnetostrictive portion. Accordingly, the change in magnetic permeability of the magnetostrictive portion can be easily detected by using the coil.

Based on the foregoing finding, the inventors arrived at the following structure of a magnetostrictive sensor.

A magnetostrictive sensor according to an embodiment of the present invention includes: a tubular or columnar substrate extending along an axis; and a magnetostrictive portion disposed on an outer peripheral surface of the substrate, and including a plurality of magnetostrictive lines. The plurality of magnetostrictive lines include adjacent first and second magnetostrictive lines that extend along an extension direction and are disposed on the outer peripheral surface of the substrate via respectively first and second contact areas. In a cross sectional view of the magnetostrictive lines taken orthogonally to the extension direction, a first length, which is a width of a widest portion of the first magnetostrictive line in a width direction parallel to the outer peripheral surface of the substrate is larger than a second length, which is a width of the first contact area in the width direction, and than a third length, which is a shortest distance between the first and second contact areas in the width direction.

Advantageous Effects of Invention

A magnetostrictive sensor according to an embodiment of the present invention can increase sensitivity even under dimensional constraints on a magnetostrictive portion.

DESCRIPTION OF EMBODIMENTS

Embodiments of the present invention will be described in detail with reference to the drawings. In the following description, dimensions of components in each drawing do not strictly represent actual dimensions of components, dimensional ratios of components, and the like.

1. Magnetostrictive Sensor 1.1. Configuration of Magnetostrictive Sensor

Figure 1:
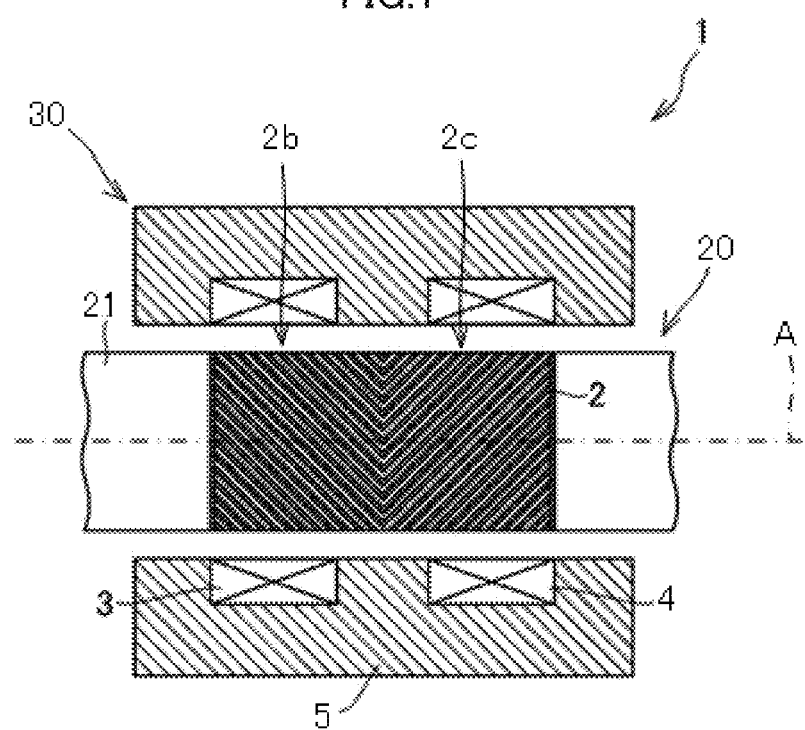
FIG. 1 is a partial cross-sectional view schematically illustrating a configuration of a torque sensor according to an embodiment of the present invention.

FIG. 1 is a partial cross-sectional view schematically illustrating a configuration of a magnetostrictive sensor according to an embodiment of the present invention. The following description is directed to a magnetostrictive torque sensor (hereinafter referred to simply as a "torque sensor" in some cases) 1 for detecting a torque acting on a substrate 21 attached to an unillustrated rotating shaft, as an example of a magnetostrictive sensor. FIG. 1 schematically illustrates a configuration of the torque sensor 1 for description.

As illustrated in FIG. 1, the torque sensor 1 includes a magnetic structure 20 including a magnetostrictive film 2 (magnetostrictive portion) and a detection unit 30 including coils 3 and 4. The magnetic structure 20 is formed in a cylindrical shape extending along an axis A. The magnetic structure 20 is disposed on an outer peripheral surface of an unillustrated rotating shaft.

Figure 2:
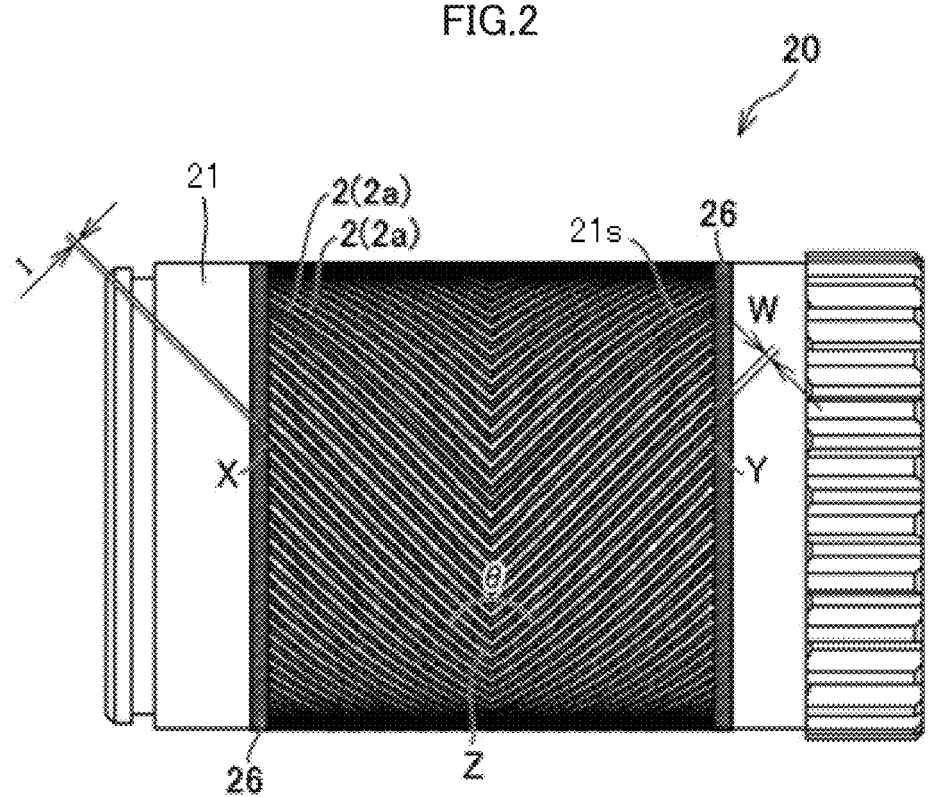
FIG. 2 is an outside view schematically illustrating a configuration of a magnetic structure included in the torque sensor illustrated in FIG. 1.

FIG. 2 schematically illustrates a configuration of the magnetic structure 20. The magnetic structure 20 includes a cylindrical substrate 21 extending along the axis A (i.e., extending axially) and the magnetostrictive film 2. The configuration of the magnetic structure 20 will be described in detail later. As illustrated in FIG. 2, the magnetostrictive film 2 is disposed on an outer peripheral surface 21s of the cylindrical substrate 21. The magnetostrictive film 2 includes a plurality of magnetostrictive lines 2a whose configuration will be described in detail later.

Figure 3:
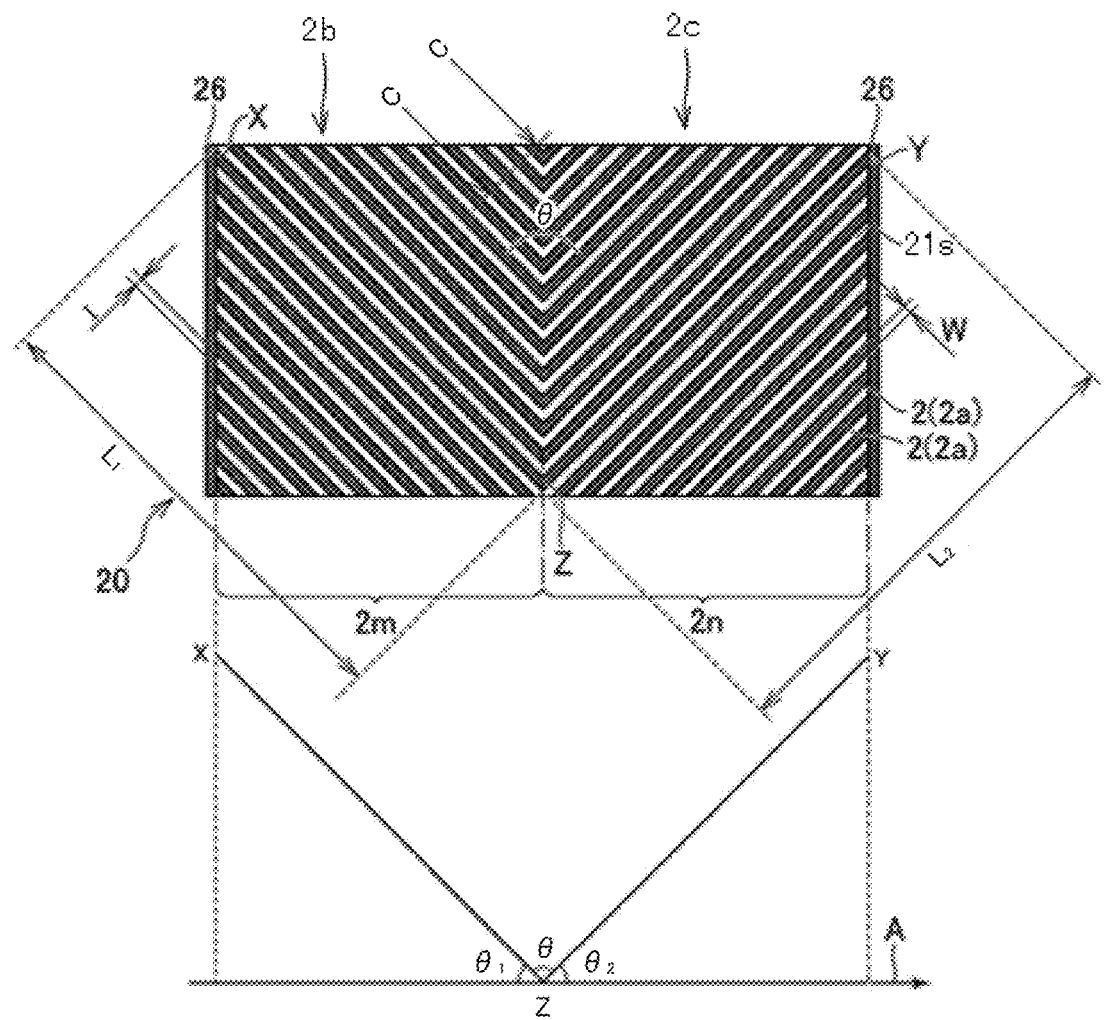
FIG. 3 illustrates an example of a pattern of a magnetostrictive film in the magnetic structure illustrated in FIG. 2.

FIG. 3 illustrates the magnetostrictive film 2 of the magnetic structure 20 seen in a direction orthogonal to the axis A (see FIG. 1). The pattern of the magnetostrictive film 2 illustrated in FIG. 3 is an example. As illustrated in FIG. 3, the magnetostrictive film 2 includes the plurality of magnetostrictive lines 2a each having a length of $L=(L_1+L_2)$ (where $L_1=L_2$ in the example of FIG. 3) and a width W. The plurality of magnetostrictive lines 2a extend in direction intersecting the axis A when viewed in the direction orthogonal to the axis A. The direction that a magnetostrictive line 2a extends is referred to as an extension direction of the magnetostrictive line 2a. In FIG. 3, an interspace between adjacent ones of the magnetostrictive lines 2a is expressed as an interspace I.

The magnetostrictive film 2 includes two regions 2b and 2c disposed side by side in the axial direction of the substrate 21. The plurality of magnetostrictive lines 2a are formed across the two regions 2b and 2c. The magnetostrictive lines 2a in one region and the magnetostrictive lines 2a in the other region are symmetric with respect to the center line of the magnetostrictive film 2 in the axial direction. That is, each of the magnetostrictive lines 2a of the magnetostrictive film 2 is formed in a V shape when viewed in the direction orthogonal to the axis A (in the state illustrated in FIG. 3).

With the above-described arrangement of the magnetostrictive lines 2a of the magnetostrictive film 2, when a torsional torque is applied to the substrate 21 through the rotating shaft, one of a tensile force and a compressive force is applied to the magnetostrictive lines 2a in the region 2b of the magnetostrictive film 2 in its extension direction. To the magnetostrictive lines 2a in the region 2c of the magnetostrictive film 2, the other one of the tensile force and the compressive force is applied in the extension direction. In this manner, magnetic permeability varies in the magnetostrictive lines 2a in the regions 2b and 2c of the magnetostrictive film 2.

The detection unit 30 includes the two cylindrical coils 3 and 4 and a yoke 5. As illustrated in FIG. 1, the coils 3 and 4 are disposed to surround the magnetic structure 20. In the example of FIG. 1, the coils 3 and 4 are disposed side by side in the axial direction with respect to the magnetic structure 20. Specifically, as illustrated in FIG. 1, the coils 3 and 4 are disposed with respect to the magnetic structure 20 in such a manner that the coil 3 surrounds one region 2b of the magnetostrictive film 2 and the coil 4 surround the other region 2c of the magnetostrictive film 2. The yoke 5 has recesses in which the coils 3 and 4 are disposed. The coils 3 and 4 are disposed inside the tubular yoke 5.

Figure 20:
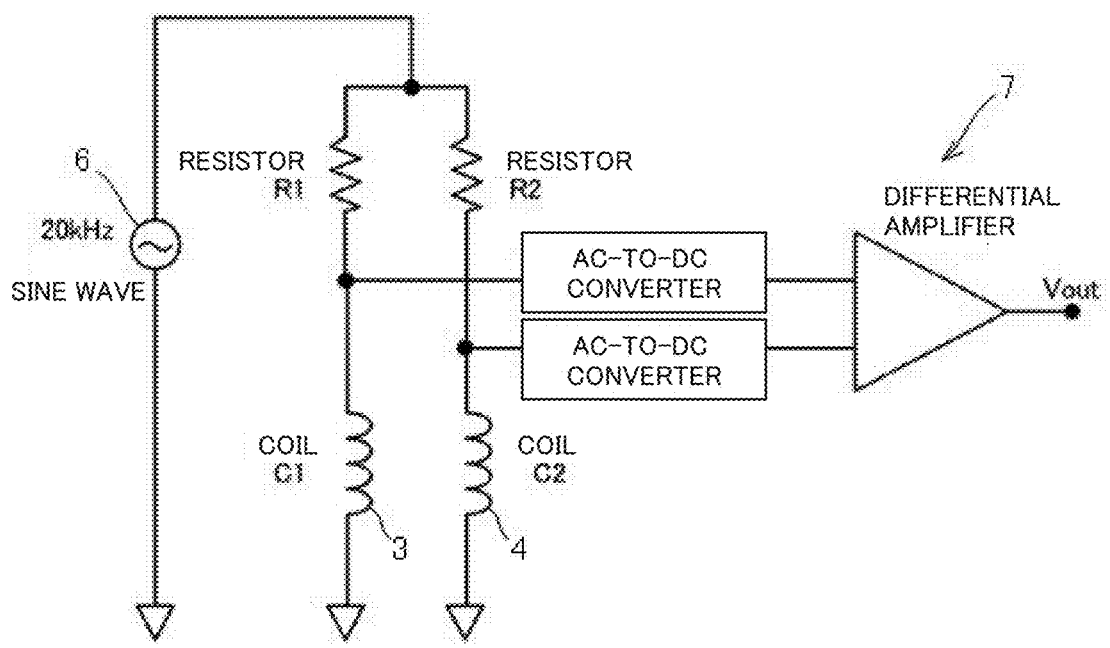
FIG. 20 schematically illustrates a configuration of a circuit for converting an impedance change of a coil to a voltage in the torque sensor illustrated in FIG. 1.

The coils 3 and 4 are connected to an alternating current (AC) power supply 6 as illustrated in FIG. 20 to thereby generate an AC magnetic field around the coils 3 and 4. The coils 3 and 4, the yoke 5, and the substrate 21 constitute a magnetic circuit. As illustrated in FIG. 20, the coils 3 and 4 are also connected to a torque detection circuit 7.

FIG. 20 illustrates an example configuration of an electronic circuit included in the torque sensor 1. The circuit configuration illustrated in FIG. 20 is widely known as the electronic circuit included in the torque sensor 1. The circuit illustrated in FIG. 20 includes the AC power supply 6 and the torque detection circuit 7. The AC power supply 6 applies an AC voltage to the coils 3 and 4. The torque detection circuit 7 detects a voltage generated in the coils 3 and 4 to thereby detect a torque generated in the substrate 21. The torque detection circuit 7 obtains a voltage difference $V_{out}$ between the coils 3 and 4 and then, based on the difference $V_{out}$, obtains the torque generated in the substrate 21 by using an unillustrated arithmetic circuit. The electronic circuit included in the torque sensor 1 is not limited to the configuration illustrated in FIG. 20.

As described above, when a torsional torque is applied to the substrate 21 through the rotating shaft, one of a tensile force and a compressive force is applied to the magnetostrictive lines 2a in the regions 2b and 2c of the magnetostrictive film 2 in the torque sensor 1 in the extension direction of the magnetostrictive lines 2a. Thus, a change in magnetic permeability occurring in the magnetostrictive lines 2a differs between the regions 2b and 2c of the magnetostrictive film 2. Such a difference in the magnetic permeability change is detected as a voltage difference between the coils 3 and 4 by the torque detection circuit 7. Thus, the torque detection circuit 7 can detect the torsional torque applied to the substrate 21.

More specifically, when a torque acts on the substrate 21, a tensile stress occurs in the magnetostrictive lines 2a in one of the regions 2b and 2c of the magnetostrictive film 2, and thus, the magnetic permeability of these magnetostrictive lines 2a increases. A compressive stress acts on the magnetostrictive lines 2a in the other region, and thus, the magnetic permeability of these magnetostrictive lines 2a decreases. Consequently, a difference occurs between impedances of the two coils 3 and 4. This impedance difference causes a voltage difference between the coils 3 and 4 that is detected by the torque detection circuit 7 as a value in accordance with the torque acting on the substrate 21. In FIG. 20, suppose $V_{out}$ at a torque of zero is $V_0$ and $V_{out}$ at an input of a rated torque is $V_t$, $V_t$-$V_0$ is an output range of the torque sensor 1.

The arrangement of the components in the torque sensor 1 illustrated in FIG. 1 is an example. The numbers and arrangements, for example, of the coils 3 and 4 and the yoke 5 are not limited to those in the configuration illustrated in FIG. 1, and may be changed as necessary by those skilled in the art.

1.2. Shape of Magnetostrictive Line

The length L/width W of the magnetostrictive lines 2a of the magnetostrictive film 2 illustrated in FIG. 3 satisfies Expression (2) below. The magnetostrictive lines 2a extend in a first direction intersecting the axis A when viewed in the direction orthogonal to the axis A in the region 2b of the magnetostrictive film 2. The magnetostrictive lines 2a extend in a second direction intersecting the first direction when viewed in the direction orthogonal to the axis A in the region 2c of the magnetostrictive film 2. That is, the magnetostrictive lines 2a have bending portions Z each bending at an angle θ, in a center portion of the magnetostrictive film 2 in the axial direction of the substrate 21. A coverage percentage of the magnetostrictive lines 2a defined in Equation (1) is 30% or more and 95% or less.

In the example illustrated in FIG. 3, when viewed in the direction orthogonal to the axis A, the magnetostrictive lines 2a extend from an end X of the magnetostrictive film 2 in the axial direction to the center portion (bending portions Z of the magnetostrictive lines 2a) of the magnetostrictive film 2 in the axial direction across the axis A, in the region 2b of the magnetostrictive film 2. The extension direction of the magnetostrictive lines 2a in the region 2b of the magnetostrictive film 2 corresponds to the first direction described above. When viewed in the direction orthogonal to the axis A, the magnetostrictive lines 2a extend in a direction at an angle θ relative to the first direction, that is, extend from the center portion (bending portions Z of the magnetostrictive lines 2a) of the magnetostrictive film 2 in the axial direction to the other end Y of the magnetostrictive film 2 in the axial direction across the axis A, in the region 2c of the magnetostrictive film 2. The extension direction of the magnetostrictive lines 2a in the region 2c of the magnetostrictive film 2 corresponds to the second direction described above.

As described above, FIG. 3 illustrates an example of the magnetostrictive film 2 in which the magnetostrictive lines 2a have the bending portions Z. Here, the bending portions Z are intersection of first portions 2m (magnetostrictive lines 2a in the region 2b) and second portions 2n (magnetostrictive lines 2a in the region 2c) of the magnetostrictive lines 2a. That is, in the magnetostrictive film 2 illustrated in FIG. 3, each magnetostrictive line 2a includes the first portion 2m extending from one end X of the magnetostrictive film 2 in the axial direction to the bending portion Z and the second portion 2n extending from the bending portion Z to the other end Y of the magnetostrictive film 2 in the axial direction.

coverage percentage=area of region in contact with magnetostrictive film 2 on outer peripheral surface 21s of substrate 21/total area (%) of outer peripheral surface 21s of substrate 21    (1)

30≤length L/width W≤120    (2)

In the magnetostrictive film 2 illustrated in FIG. 3, the length L/width W of the magnetostrictive lines 2a is the sum of the length/width of the magnetostrictive lines 2a in the first portions 2m and the length/width of the magnetostrictive lines 2a in the second portions 2n. The length/width of each magnetostrictive line 2a in the first portion 2m can be obtained by (length $L_1$ of magnetostrictive line 2a from end X to bending portion Z illustrated in FIG. 3)/(width of magnetostrictive line 2a in first portion 2m). The length/width of each magnetostrictive line 2a in the second portion 2n can be obtained by (length $L_2$ of magnetostrictive line 2a from bending portion Z to end Y illustrated in FIG. 3)/(width of magnetostrictive line 2a in second portion 2n).

If the coverage percentage defined by Equation (1) is within the above-described range (30% or more and 95% or less), the torque sensor 1 having high sensitivity can be obtained. That is, in Equation (1), if the coverage percentage is 30% or more, sufficient sensitivity of the torque sensor 1 can be obtained. If the coverage percentage is 95% or less, the shape of the magnetostrictive film 2 does not vary easily. Accordingly, if the coverage percentage is 95% or less, adjacent ones of the magnetostrictive lines 2a do not contact each other, and thus, sufficient sensitivity of the torque sensor 1 can be obtained. The coverage percentage is preferably 50% or more. The coverage percentage is more preferably 60% or more. The coverage percentage is preferably 93% or less. The coverage percentage is more preferably 90% or less. The coverage percentage is much more preferably 85% or less.

Since the length L/width W is within the range defined by Expression (2), the torque sensor 1 having high sensitivity can be obtained. In Expression (2), if the length L/width W is 30 or more, sufficient sensitivity of the torque sensor 1 can be obtained. If the length L/width W is 120 or less, the magnetostrictive film 2 can be easily fabricated. The length L/width W is preferably less than 95. The length L/width W is more preferably less than 85. The length L/width W is preferably 43 or more. The length L/width W is more preferably 53 or more. The length L/width W is much more preferably 75 or more.

From the viewpoint of further increasing sensitivity, in the case where the magnetostrictive line 2a has the bending portion Z, the angle formed by the first direction and the second direction in the bending portion Z of the magnetostrictive line 2a ($\theta$ in FIG. 3, i.e., an angle formed by the first portion 2m and the second portion 2n) is preferably 60° or more and 120° or less. The angle is more preferably 80° or more. The angle is preferably 100° or less. In the case where the magnetostrictive line 2a does not have a bending portion (e.g., a magnetostrictive line 902a of a magnetostrictive film 902 illustrated in FIG. 12), if the angle formed by the first portion 2m and the second portion 2n is within the range described above, sensitivity of the torque sensor 1 can be further increased.

From the viewpoint of further increasing sensitivity of the torque sensor 1, in each magnetostrictive line 2a, the absolute value of an angle $\theta_1$ formed by the axis A and the first direction when viewed in the direction orthogonal to the axis A of the substrate 21 is preferably 30° or more and 60° or less (more preferably the angle $\theta_1$ is ±45°) as illustrated in FIG. 3. The absolute value of an angle $\theta_2$ formed by the substrate 21 and the second direction is preferably 30° or more and 60° or less (more preferably angle $\theta_2$ is ±45°).

The magnetostrictive film 2 illustrated in FIG. 3 further includes connecting parts 26 each connecting ends of adjacent ones of the magnetostrictive lines 2a in the axial direction. In the magnetostrictive film 2 illustrated in FIG. 3, the connecting parts 26 are disposed at both axial ends of the magnetostrictive lines 2a. Since the connecting parts 26 connecting the plurality of magnetostrictive lines 2a are provided in the magnetostrictive film 2, the plurality of magnetostrictive lines 2a are not easily separated from the substrate 21. Thus, strength of magnetostrictive film 2 can be enhanced.

1.3. Specific Example of Magnetostrictive Film Pattern

FIGS. 4 through 12 illustrate other examples of the magnetostrictive lines 2a in the magnetostrictive film 2 of the magnetic structure 20 illustrated in FIG. 2.

Figure 4:
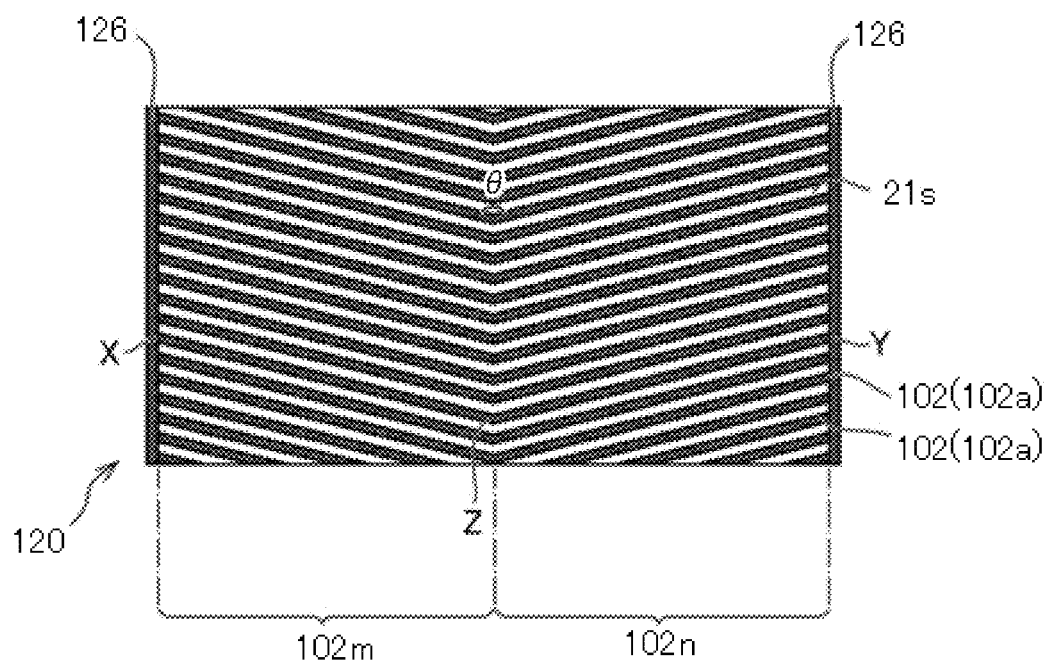
FIG. 4 illustrates another example of the pattern of the magnetostrictive film in the magnetic structure illustrated in FIG. 2.

A magnetostrictive film 102 illustrated in FIG. 4 is different from the magnetostrictive film 2 illustrated in FIG. 3 in the angle $\theta$ formed by a first portion 102m and a second portion 102n of each magnetostrictive line 102a. More specifically, in the magnetostrictive film 102 illustrated in FIG. 4, the angle $\theta$ exceeds 90° (and less than 180°).

In FIG. 4, reference numeral 120 denotes a magnetic structure. Reference numeral 126 denotes a connecting part.

Figure 5:
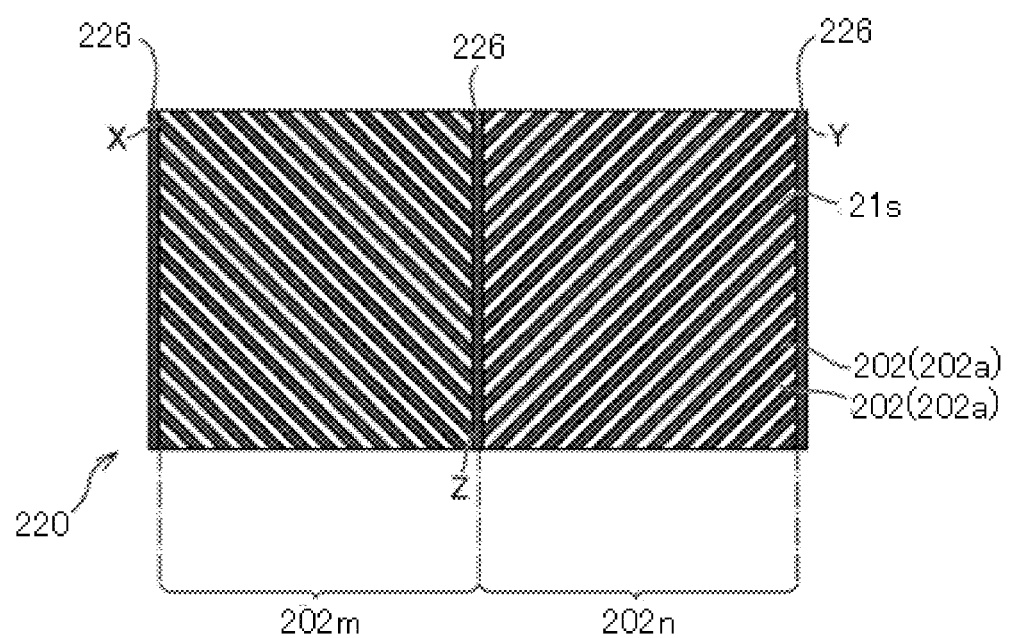
FIG. 5 illustrates yet another example of the pattern of the magnetostrictive film in the magnetic structure illustrated in FIG. 2.

In a manner similar to the magnetostrictive film 2 illustrated in FIG. 3, a magnetostrictive film 202 illustrated in FIG. 5 includes connecting parts 226 connecting ends of adjacent magnetostrictive lines 202a at both axial ends of the magnetostrictive line 202a. The magnetostrictive film 202 also includes a connecting part 226 connecting bending portions Z of adjacent magnetostrictive lines 202a. In the magnetostrictive film 202 illustrated in FIG. 5, the connecting parts 226 connecting the bending portions Z of adjacent magnetostrictive lines 202a can further enhance the strength of the magnetostrictive film 202 including the plurality of magnetostrictive lines 202a.

In FIG. 5, reference numeral 220 denotes a magnetic structure. Reference numeral 202m denotes a first portion of the magnetostrictive line 202a. Reference numeral 202n denotes a second portion of the magnetostrictive line 202a.

Figure 6:
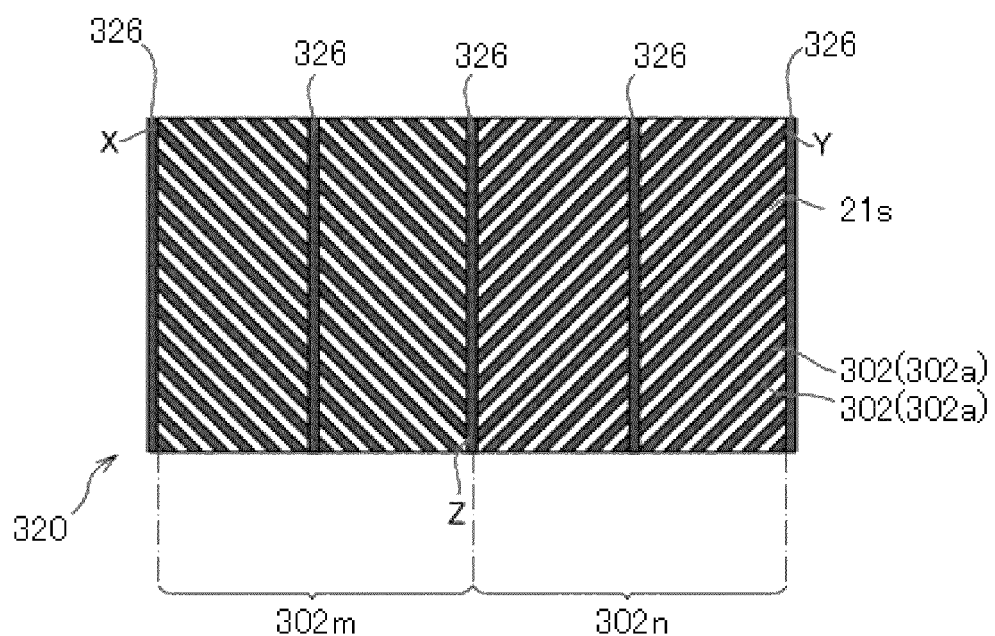
FIG. 6 illustrates still another example of the pattern of the magnetostrictive film in the magnetic structure illustrated in FIG. 2.

In a manner similar to the magnetostrictive film 202 illustrated in FIG. 5, in magnetostrictive lines 302a constituting a magnetostrictive film 302 illustrated in FIG. 6, connecting parts 326 connecting axial ends of adjacent magnetostrictive lines 302a connect both axial ends of magnetostrictive lines 302a and bending portions Z to one another. The magnetostrictive film 302 also includes a connecting part 326 connecting axial center portions of first portions 302m of adjacent magnetostrictive lines 302a and a connecting part 326 connecting axial center portions of second portions 302n of adjacent magnetostrictive lines 302a. In the magnetostrictive film 302 illustrated in FIG. 6, the connecting parts 326 connecting the first portions 302m of adjacent magnetostrictive lines 302a or the second portions 302n of adjacent magnetostrictive lines 302a further enhance strength of the magnetostrictive film 302.

In FIG. 6, reference numeral 320 denotes a magnetic structure.

Figure 7:
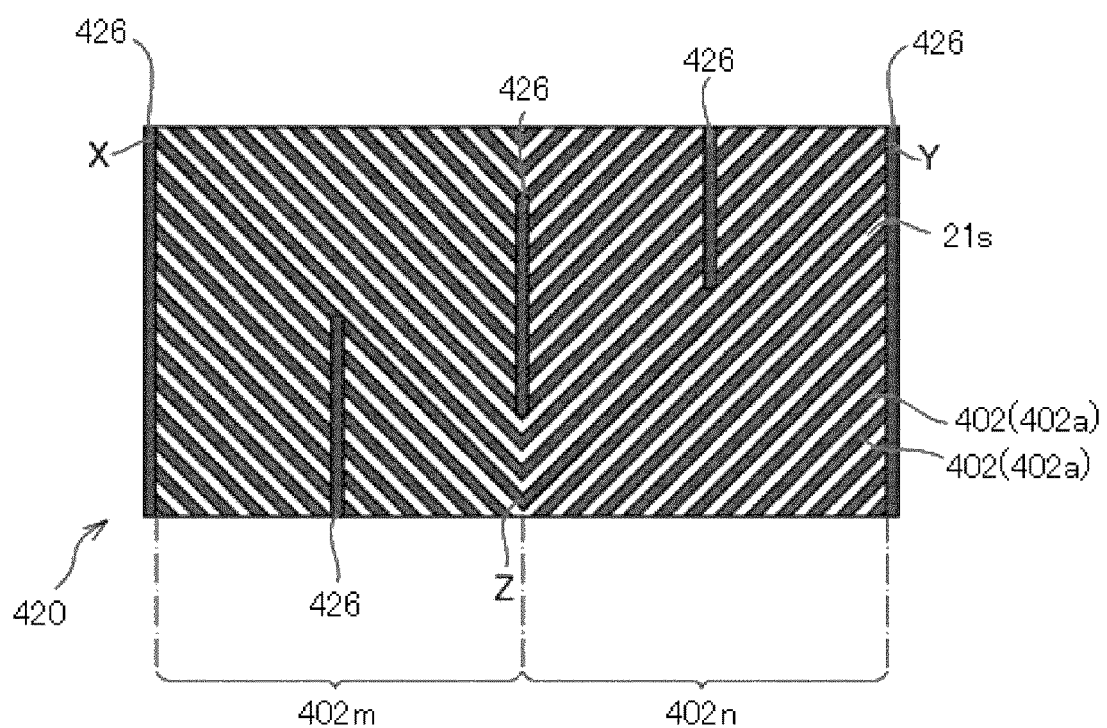
FIG. 7 illustrates even another example of the pattern of the magnetostrictive film in the magnetic structure illustrated in FIG. 2.

As illustrated in FIG. 7, among connecting parts 426 connecting adjacent magnetostrictive lines 402a to one another, connecting parts 426 except connecting parts 426 connecting axial ends may connect only some of the plurality of magnetostrictive lines 402a.

In FIG. 7, reference numeral 420 denotes a magnetic structure. Reference numeral 402 denotes a magnetostrictive film. Reference numeral 402a denotes a magnetostrictive line. Reference numeral 402m denotes a first portion of the magnetostrictive line 402a. Reference numeral 402n denotes a second portion of the magnetostrictive line 402a.

Figure 8:
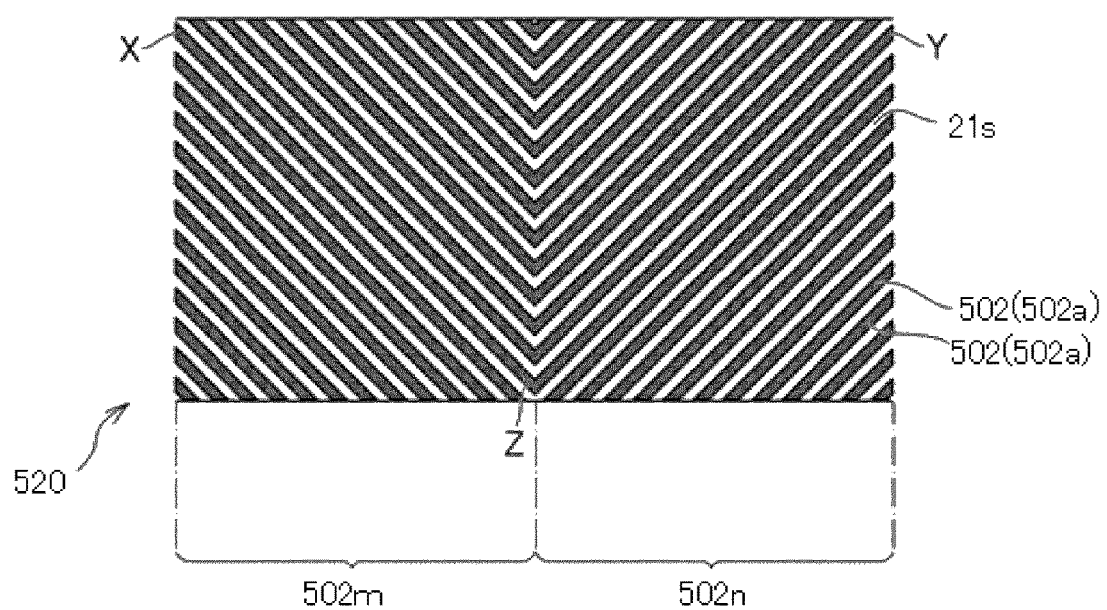
FIG. 8 illustrates yet another example of the pattern of the magnetostrictive film in the magnetic structure illustrated in FIG. 2.
Figure 9:
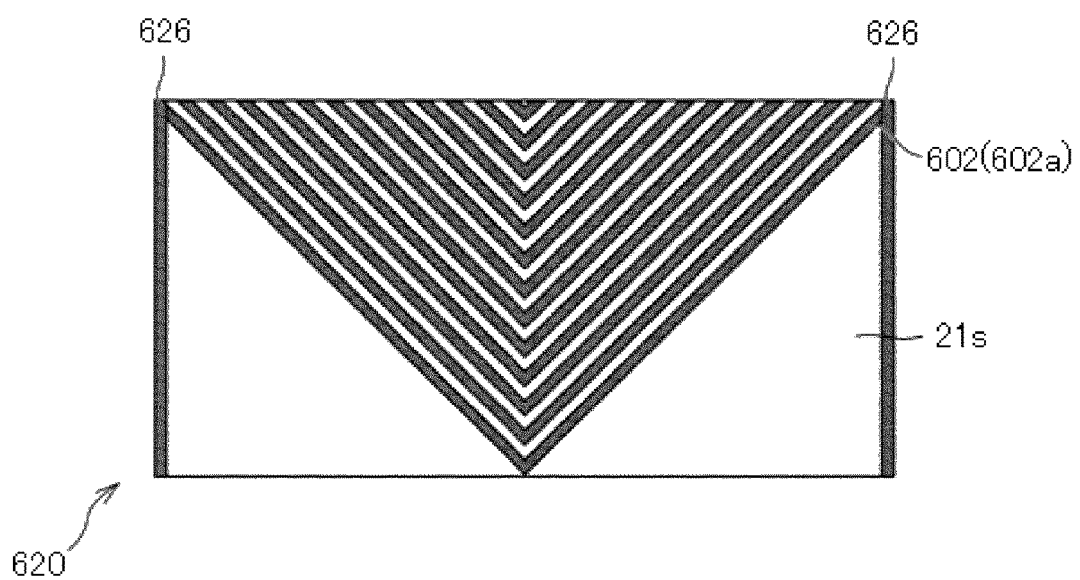
FIG. 9 illustrates still another example of the pattern of the magnetostrictive film in the magnetic structure illustrated in FIG. 2.
Figure 10:
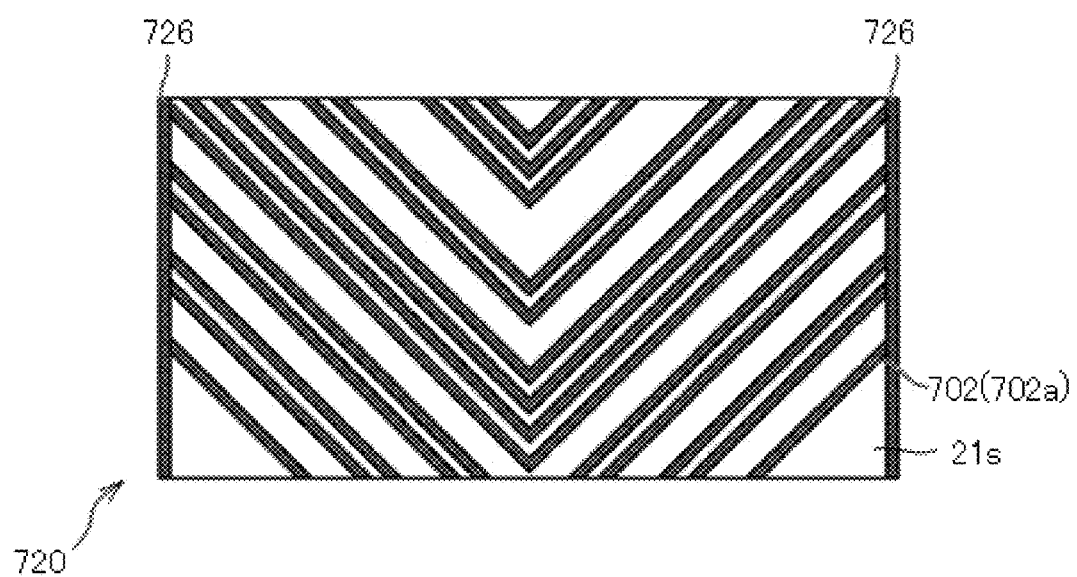
FIG. 10 illustrates yet another example of the pattern of the magnetostrictive film in the magnetic structure illustrated in FIG. 2.
Figure 11:
FIG. 11 illustrates another example of the pattern of the magnetostrictive film in the magnetic structure illustrated in FIG. 2.

As illustrated in FIG. 8, a magnetostrictive film 502 may not include any connecting part. Alternatively, as illustrated in FIG. 9, a magnetostrictive film 602 may include a plurality of magnetostrictive lines 602a provided only in a part of the outer peripheral surface of a substrate. As illustrated in FIG. 10, the interspace between adjacent magnetostrictive lines 702a in a magnetostrictive film 702 does not need to be uniform. As illustrated in FIG. 11, a plurality of magnetostrictive lines 802a in a magnetostrictive film 802 does not need to have a uniform width W. As illustrated in FIG. 11, in a case where a magnetostrictive film 802 includes a plurality of magnetostrictive lines 802a having different widths W, the length L/width W defined in Expression (2) represents an average value of the length L/width W of each magnetostrictive line 802a.

In FIG. 8, reference numeral 520 denotes a magnetic structure. Reference numeral 502a denotes a magnetostrictive line. Reference numeral 502m denotes a first portion of the magnetostrictive line 502a. Reference numeral 502n denotes a second portion of the magnetostrictive line 502a.

In FIG. 9, reference numeral 626 denotes a connecting part. In FIG. 10, reference numeral 720 denotes a magnetic structure. Reference numeral 726 denotes a connecting part. In FIG. 11, reference numeral 826 denotes a connecting part.

Figure 12:
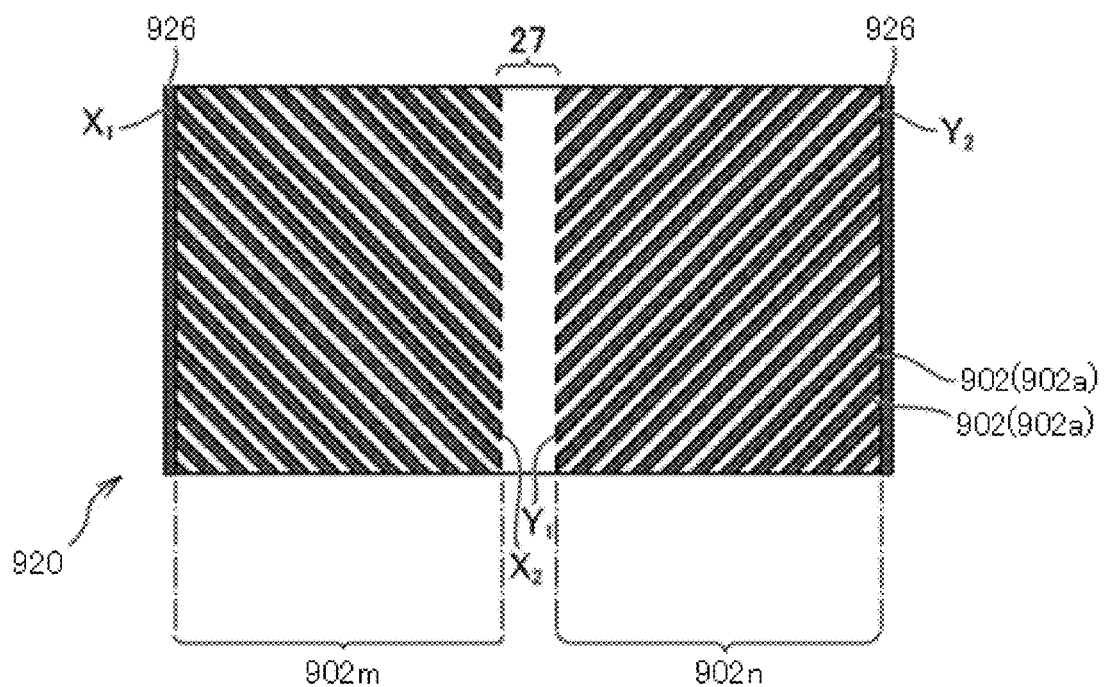
FIG. 12 illustrates yet another example of the pattern of the magnetostrictive film in the magnetic structure illustrated in FIG. 2.

A magnetostrictive film 902 illustrated in FIG. 12 is a variation of the magnetostrictive film 2 illustrated in FIG. 3. In the magnetostrictive film 902 illustrated in FIG. 12, the bending portions Z of the magnetostrictive lines 2a illustrated in FIG. 2 are replaced by a gap 27 so that first portions 902m are separated from second portions 902n. In the magnetostrictive film 902 illustrated in FIG. 12, magnetostrictive lines 902a are interrupted, and thus, a demagnetizing factor increases as compared to the configurations illustrated in FIGS. 3 through 11. In this manner, sensitivity of the torque sensor becomes relatively lower than that of the configuration of the magnetostrictive film illustrated in FIG. 3.

In the magnetostrictive lines 902a illustrated in FIG. 12, the length L/width W defined by Expression (2) represents (distance from one end $X_1$ to the other end $X_2$ of the first portion 902m in the axial direction)/(width of the magnetostrictive line 902a in the first portion 902m) or (distance from one end $Y_1$ to the other end $Y_2$ of the second portion 902n in the axial direction)/(width of the magnetostrictive line 902a in the second portion 902n).

In FIG. 12, reference numeral 920 denotes a magnetic structure. Reference numeral 926 denotes a connecting part.

Figure 13:
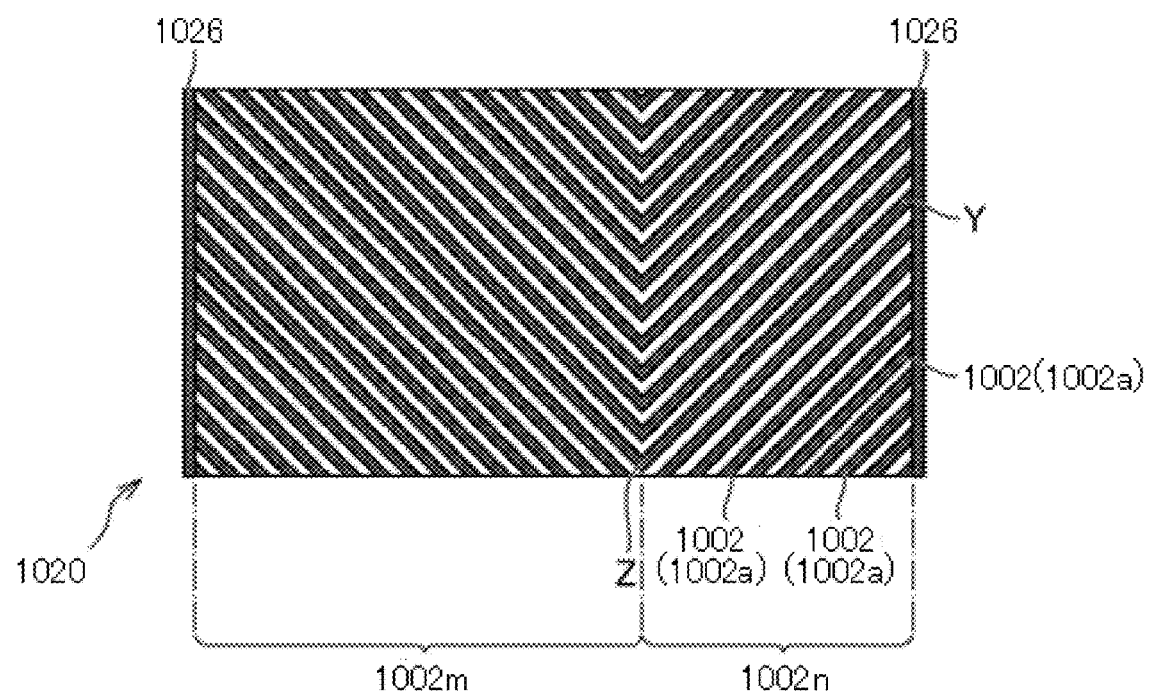
FIG. 13 illustrates still another example of the pattern of the magnetostrictive film in the magnetic structure illustrated in FIG. 2.

A magnetostrictive film 1002 illustrated in FIG. 13 is different from the magnetostrictive film 2 illustrated in FIG. 3 in positions of bending portions Z in the axial direction. More specifically, in the magnetostrictive film 2 illustrated in FIG. 3, the length $L_1$ of the first portion 2m constituting each magnetostrictive line 2a is equal to the length $L_2$ of the second portion 2n constituting the magnetostrictive line 2a. In the magnetostrictive film 2 illustrated in FIG. 3, in the axial direction, the magnetostrictive lines 2a are line symmetric with respect to the center line of the magnetostrictive film 2. On the other hand, in the magnetostrictive film 1002 illustrated in FIG. 13, the length of the first portion 1002m is different from the length of the second portion 1002n (where FIG. 13 shows a case where the length of the first portion 1002m is larger than that of the second portion 1002n). The ratio of the first portion 1002m to the second portion 1002n is preferably 0.5 or more and 2 or less.

In FIG. 13, reference numeral 1020 denotes a magnetic structure. Reference numeral 1026 denotes a connecting part.

1.4. Cross Section of Magnetic Structure

Figure 14:
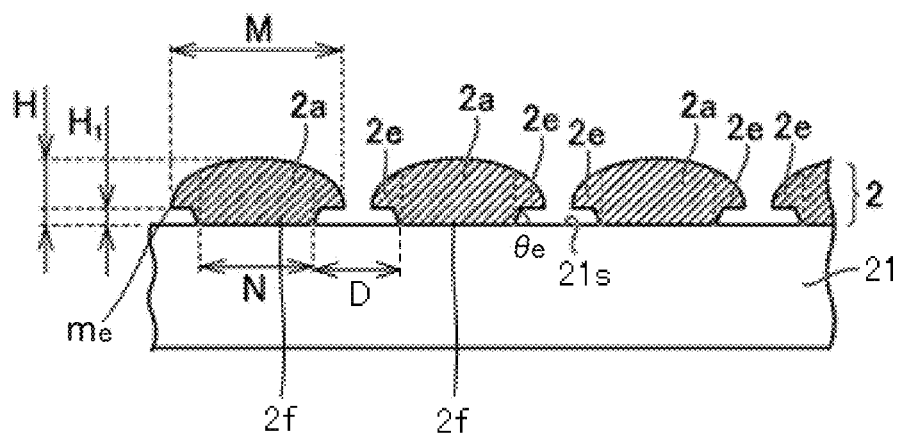
FIG. 14 is a cross-sectional view schematically illustrating an example configuration of the magnetic structure illustrated in FIG. 2.

FIG. 14 schematically illustrates a cross section of the magnetic structure 20 illustrated in FIG. 1. The cross section illustrated in FIG. 14 is obtained by cutting the magnetic structure 20 in a plane orthogonal to the extension direction of the magnetostrictive lines 2a. More specifically, the cross section illustrated in FIG. 14 is a cross section in a case where the magnetostrictive lines 2a are cut in a plane perpendicular to the first direction (i.e., direction from the end X of the magnetostrictive film 2 to the bending portions Z in FIG. 2), that is, a cross section taken along line C-C in FIG. 3 in a direction perpendicularly to the drawing sheet. As illustrated in FIG. 14, the magnetic structure 20 includes the cylindrical substrate 21 and the magnetostrictive film 2 disposed on the outer peripheral surface 21s of the substrate 21. In FIG. 14, "M" corresponds to "W" in FIG. 3.

1.4.1. Magnetostrictive Film

The magnetostrictive film 2 is made of a material including a magnetic material. The magnetic material is preferably a ferromagnetic material. Specifically, the magnetic material preferably includes at least one of the metals selected from Ni, Fe, Co, and Cr. From the viewpoint of obtaining high magnetic permeability and high magnetostrictive effect, the magnetic material more preferably includes Fe and at least one of the metals selected from Ni, Co, and Cr. The magnetostrictive film 2 may further include a metal such as Al, Ti, Ge, Mo, Ag, or Cu or a nonmetal material such as Si, B, S, C, O, or N.

For example, in a case where the magnetostrictive film 2 contains Fe, from the viewpoint of obtaining higher magnetic permeability and higher magnetostrictive effect, the Fe content of the magnetostrictive film 2 is preferably 20 mass % or more and 40 mass % or less. The Fe content is more preferably 23 mass % or more. The Fe content is much more preferably 26 mass % or more. The Fe content is more preferably 36 mass % or less. The Fe content is much more preferably 33 mass % or less. The total content of metals except Fe (at least one of the metals selected from Ni, Co, and Cr) is preferably 60 mass % or more and 80 mass % or less. The total content of metals except Fe is more preferably 64 mass % or more. The total content of metals except Fe is much more preferably 67 mass % or more. The total content of metals except Fe is more preferably 77 mass % or less. The total content of metals except Fe is much more preferably 74 mass % or less.

In a case where the magnetostrictive film 2 contains Fe and Ni, the Ni content is preferably 60 mass % or more and 80 mass % or less. The Ni content is more preferably 64 mass % or more. The Ni content is much more preferably 67 mass % or more. The Ni content is more preferably 77 mass % or less. The Ni content is much more preferably 74 mass % or less.

In a case where the magnetostrictive film 2 contains S, the S content of the magnetostrictive film 2 is preferably 0.03 mass % or more and 0.12 mass % or less. The S content is more preferably 0.04 mass % or more and 0.10 mass % or less. The S content is much more preferably 0.05 mass % or more and 0.09 mass % or less.

The maximum thickness H of the magnetostrictive film 2 (the distance from the surface of the magnetostrictive film 2 contacting the substrate 21, i.e., the outer peripheral surface 21s of the substrate 21, to the tip of projection of the magnetostrictive film 2 outward in the radial direction of the substrate 21) is 20 µm or more and 200 µm or less. The maximum thickness H is preferably 40 µm or more. The maximum thickness H is more preferably 60 µm or more. The maximum thickness H is preferably 140 µm or less. The maximum thickness H is more preferably 100 µm or less.

In a cross sectional view of the magnetostrictive lines 2a taken orthogonally to the extension direction of the magnetostrictive lines 2a, the magnetostrictive lines 2a have portions outside in the radial direction of the substrate 21 that are longer than portions of the magnetostrictive lines 2a near the substrate 21 in the direction orthogonal to the radial direction of the substrate 21 (direction parallel to the outer peripheral surface 21s of the substrate 21). Specifically, the magnetostrictive lines 2a have projections 2e projecting from bodies of the magnetostrictive lines 2a on the substrate 21 in opposite directions orthogonal to the radial direction of the substrate 21. The presence of the projections 2e of the magnetostrictive lines 2a increases the surface area of the magnetostrictive lines 2a.

In this case, an angle $\theta_e$ formed by the interface between the magnetostrictive lines 2a and the substrate 21 and the projecting direction of the projections 2e is preferably an acute angle (less than 90°). In this case, from the viewpoint of further enhancing sensitivity of the sensor, the angle $\theta_e$ is more preferably greater than 0° and less than or equal to 45°. The angle $\theta_e$ is much more preferably 30° or less.

Since the magnetostrictive lines 2a of the magnetostrictive film 2 have the projections 2e described above, in the cross section illustrated in FIG. 14, the width M at a predetermined distance from the outer peripheral surface 21s of the substrate 21 in the radial direction of the substrate 21 (thickness direction of the magnetostrictive line 2a) is larger than a width N of a contact area 2f between the magnetostrictive film 2 and the outer peripheral surface 21s of the substrate 21.

That is, in the cross sectional view of the magnetostrictive lines 2a taken orthogonally to the extension direction thereof (i.e., cross section illustrated in FIG. 14), the plurality of magnetostrictive lines 2a of the magnetostrictive film 2 have the length of the longest portion (length M at the predetermined distance described above, which will be hereinafter referred to as a maximum width M; first length) that is larger than the length N (second length) of the contact area 2f between the magnetostrictive film 2 and the outer peripheral surface 21s of the substrate 21, in the direction (width direction) orthogonal to the radial direction of the substrate 21. The maximum width M is larger than the length of the interspace D (third length) between adjacent magnetostrictive lines 2a. The interspace D between adjacent magnetostrictive lines 2a refers to an interspace from the contact area 2f (first contact area) between the magnetostrictive line 2a (first magnetostrictive line) and the substrate 21 to the contact area 2f (second contact area) between its adjacent magnetostrictive line 2a (second magnetostrictive line) and the substrate 21.

In the magnetostrictive film 2, the magnetostrictive lines 2a having the shape described above can enhance sensitivity of the torque sensor 1. That is, in the cross sectional view of the magnetostrictive lines 2a taken orthogonally to the extension direction of the magnetostrictive lines 2a, the maximum width M of the magnetostrictive lines 2a in the magnetostrictive film 2 is larger than the length of the interspace D between adjacent magnetostrictive lines 2a. In such a configuration, the interspace D between the magnetostrictive lines 2a is relatively narrow. In such a case where the interspace D between adjacent magnetostrictive lines 2a is narrow, the maximum width M of the magnetostrictive lines 2a can be made larger than the length N of the contact area 2f between the magnetostrictive film 2 and the outer peripheral surface 21s of the substrate 21 so that the surface area of the magnetostrictive lines 2a, that is, the surface area of the magnetostrictive film 2, can be increased. The increase in the surface area of the magnetostrictive film 2 enables the magnetic permeability of the magnetostrictive film 2 to vary in a wide range. In this manner, a change in magnetic permeability upon application of a force to the magnetostrictive film 2 can be easily detected. Thus, sensitivity of the torque sensor 1 can be enhanced.

In other words, with the configuration described above, sensitivity of the torque sensor 1 can be enhanced without changes in the coverage percentage defined in Equation (1) and the value of length L/width W defined in Expression (2).

The length of the interspace D from the contact area 2f between one magnetostrictive line 2a and the outer peripheral surface 21s of the substrate 21 to the contact area 2f between its adjacent magnetostrictive line 2a and the outer peripheral surface 21s of the substrate 21 is larger than the sum of the length of the projection 2e of one magnetostrictive line 2a projecting toward its adjacent magnetostrictive line 2a and the length of the projection 2e of the adjacent magnetostrictive line 2a projecting toward the magnetostrictive line 2a.

In this manner, in adjacent magnetostrictive lines 2a, contact between the projections 2e can be prevented.

In the cross sectional view of the magnetostrictive lines 2a illustrated in FIG. 14, the magnetostrictive lines 2a has a maximum width M larger than the height (maximum thickness) H of the magnetostrictive lines 2a in the thickness direction (height direction). In this manner, the magnetostrictive lines 2a are formed in a flat shape that is longer in the direction (direction parallel to the outer peripheral surface 21s of the substrate 21) orthogonal to the radial direction of the substrate 21 than in the thickness direction. Accordingly, the surface area of the magnetostrictive lines 2a can be further increased. Thus, a change in magnetic permeability upon application of a force to the magnetostrictive film 2 can be more easily detected.

In the cross section of FIG. 14, from the viewpoint of further enhancing sensitivity of the sensor, the ratio $H_1/H$ between the maximum thickness H of the magnetostrictive line 2a and the height of ends $m_e$ of the magnetostrictive line 2a (distance from the interface between the magnetostrictive line 2a and the substrate 21 to the tip of the projection 2e, i.e., the height from the outer peripheral surface 21s of the substrate 21 to the position of the maximum width M; first distance) $H_1$ is less than one. The $H_1/H$ is preferably 0.8 or less. The $H_1/H$ is more preferably 0.5 or less. The $H_1/H$ is much more preferably 0.3 or less. On the other hand, the $H_1/H$ is preferably 0.015 or more.

The magnetostrictive lines 2a are formed in such a manner that the ratio $H_1/H$ is within the ranges described above so that the surface area of the magnetostrictive lines 2a can be further increased. Thus, a change in magnetic permeability upon application of a force to the magnetostrictive film 2 can be more easily detected.

By setting $H_1/H$ at 0.5 or less, that is, by setting a half height of the maximum thickness H of the magnetostrictive lines 2a at a position higher than or equal to the maximum width M from the outer peripheral surface 21s of the substrate 21, a portion having a width larger than that of the contact area 2f between the magnetostrictive line 2a and the outer peripheral surface 21s of the substrate 21 can be provided in a wide range in the thickness direction of the magnetostrictive line 2a. Accordingly, the surface area of the magnetostrictive lines 2a can be further increased. Thus, a change in magnetic permeability upon application of a force to the magnetostrictive films 2 can be more easily detected.

Figure 17:
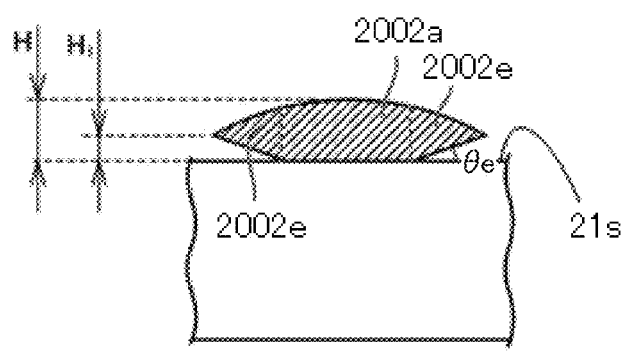
FIG. 17 is a cross-sectional view illustrating another example of the magnetic structure illustrated in FIG. 2.
Figure 18:
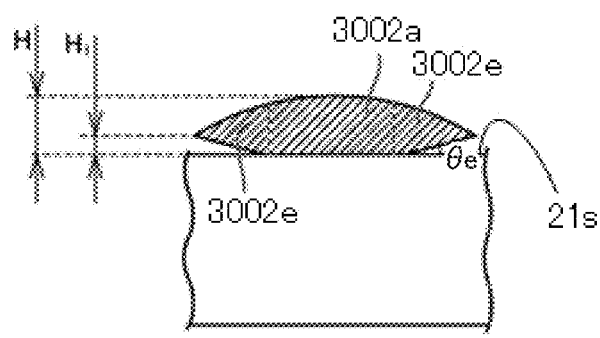
FIG. 18 is a cross-sectional view illustrating yet another example of the magnetic structure illustrated in FIG. 2.
Figure 19:
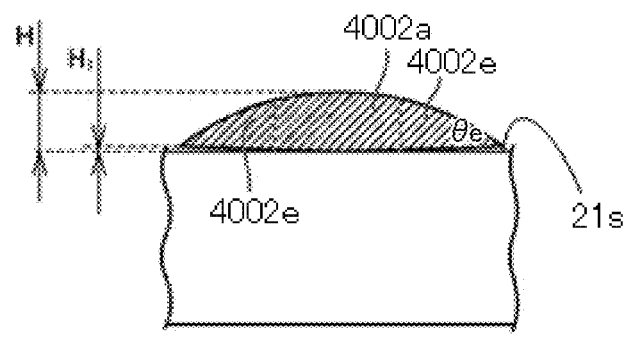
FIG. 19 is a cross-sectional view illustrating still another example of the magnetic structure illustrated in FIG. 2.

Each of FIGS. 17, 18, and 19 is a cross-sectional view (cross-sectional view taken along a plane orthogonal to the extension direction of the magnetostrictive lines 2a) illustrating another example of the magnetic structure by using a cross section similar to that of FIG. 14. Each of FIGS. 17, 18, and 19 illustrates a case where the angle $\theta_e$ formed by the outer peripheral surface 21s of the substrate 21 and the projection direction of projections 2002e, 3002e, or 4002e of magnetostrictive lines 2002a, 3002a, or 4002a and the ratio $H_1/H$ are different from those of the example illustrated in FIG. 14 (specifically the angles $\theta_e$ are 20°, 5°, and 3°, and the ratios $H_1/H$ are 0.5, 0.2, and 0.1, respectively).

Figure 15:
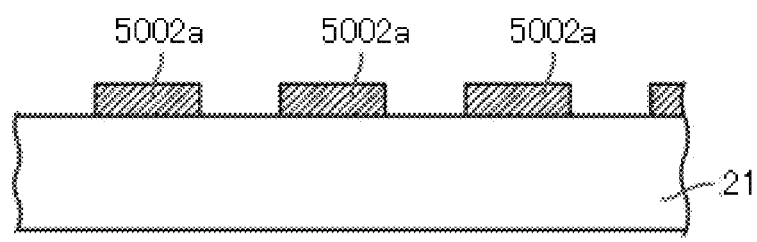
FIG. 15 is a cross-sectional view schematically illustrating a configuration in a case where magnetostrictive lines are rectangular in cross section.

As illustrated in FIG. 15, in the case where the magnetostrictive lines 5002a have rectangular cross sections (i.e., where the magnetostrictive lines 5002a have no projections 2e), the surface area of the magnetostrictive lines 5002a are smaller than those of the magnetostrictive lines 2a, 2002a, 3002a, and 4002a having cross sections illustrated in FIGS. 14 and 17 through 19. Thus, sensitivity of the torque sensor is lower than those of the magnetostrictive lines 2a, 2002a, 3002a, and 4002a having the cross sections illustrated in FIGS. 14 and 17 through 19.

1.4.2. Substrate

The substrate 21 is made of a material having a composition different from that of the magnetostrictive film 2, and is, for example, made of a material having a magnetic permeability lower than that of the magnetostrictive film 2. The substrate 21 is preferably made of a magnetic material, and is more preferably made of a ferromagnetic material such as Fe, Ni, Co, or Cr. The substrate 21 may contain a metal such as Al, Ti, Ge, Mo, Ag, or Cu or a nonmetal material such as Si, B, S, C, O, or N.

1.4.3. Resist Layer

The magnetic structure 20 may further include a resist layer formed on the surface of the magnetostrictive film 2. In this case, the resist layer preferably has a thickness of 45 μm or less.

1.5. Method for Fabricating Magnetic Structure

Figure 16A:
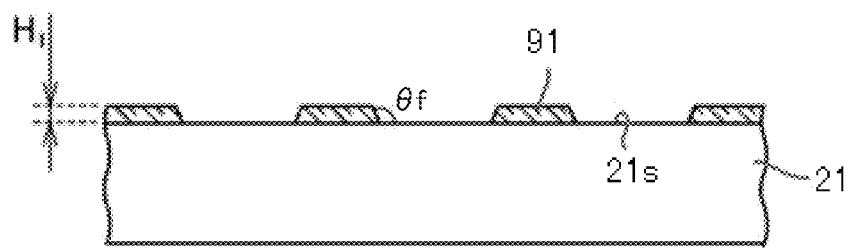
FIGS. 16A and 16B are cross-sectional views schematically illustrating a method for fabricating the magnetic structure illustrated in FIG. 14.
Figure 16B:
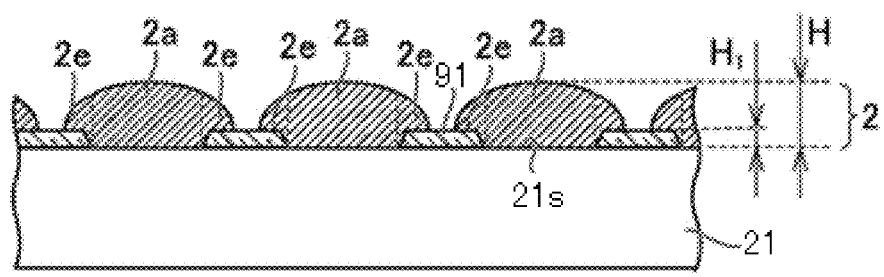

FIGS. 16A and 16B are views for describing a method for fabricating a magnetic structure 20. FIGS. 16A and 16B are cross-sectional views taken along the same plane as that in FIG. 14, and illustrate the substrate 21, the magnetostrictive film 2, the resist layer 91, and so forth in the process of fabricating the magnetic structure 20.

The method for fabricating a magnetic structure 20 includes the step of forming a resist layer 91 having a predetermined pattern on an outer peripheral surface 21s of a substrate 21 and the step of forming a magnetostrictive film 2 on the outer peripheral surface 21s of the substrate 21 on which the resist layer 91 is disposed. The method for fabricating the magnetic structure 20 will now be specifically described.

First, as illustrated in FIG. 16A, the resist layer 91 having a predetermined pattern is formed on the outer peripheral surface 21s of the substrate 21. This resist layer 91 is used for forming magnetostrictive lines 2a illustrated in FIGS. 1, 2, and 3 through 12. The resist layer 91 can be formed by, for example, a known method such as water transfer or screen printing. The thickness of the resist layer 91 is, for example, 3 μm or more and 45 μm or less. To form projections 2e in the magnetostrictive lines 2a, an angle $\theta_f$ formed by the outer peripheral surface 21s of the substrate 21 and an end of the resist layer 91 is preferably an obtuse angle (exceeding 90°).

Next, as illustrated in FIG. 16B, a magnetostrictive film 2 is formed on the surface of the substrate 21 on which the resist layer 91 is provided. In this step, the magnetostrictive film 2 is formed in such a manner that a height H of the magnetostrictive film 2 exceeds a height $H_1$ of the resist layer 91. The formation of the magnetostrictive film 2 may employ a known method such as sputtering, CVD, or plating. Thereafter, a heat treatment is preferably performed at a predetermined temperature (e.g., 300° C. or more and 1,000° C. or less) for a predetermined time (e.g., one minute or more and 48 hours or less). In the foregoing manner, the magnetic structure 20 including the magnetostrictive film 2 illustrated in FIG. 14 can be obtained.

With the fabrication method according to this embodiment, after the formation of the resist layer 91 on the surface of the substrate 21, the magnetostrictive film 2 is deposited and is subjected to a heat treatment. Thus, the magnetic structure 20 having high sensitivity can be obtained with a simple method and a short process. In addition, fabrication costs of the magnetic structure 20 can be reduced.

2. Electric Motor-Assisted Bicycle

An electric motor-assisted bicycle (e.g., a bicycle, a tricycle, or a four-wheel vehicle) according to an embodiment of the present invention includes the torque sensor 1 according to the embodiment described above. In an electric motor-assisted bicycle 10 according to this embodiment, the torque sensor 1 detects a torque generated when an occupant pedals. In the electric motor-assisted bicycle 10, based on the value of the torque detected by the torque sensor 1, driving of an electric motor is controlled.

Figure 21:
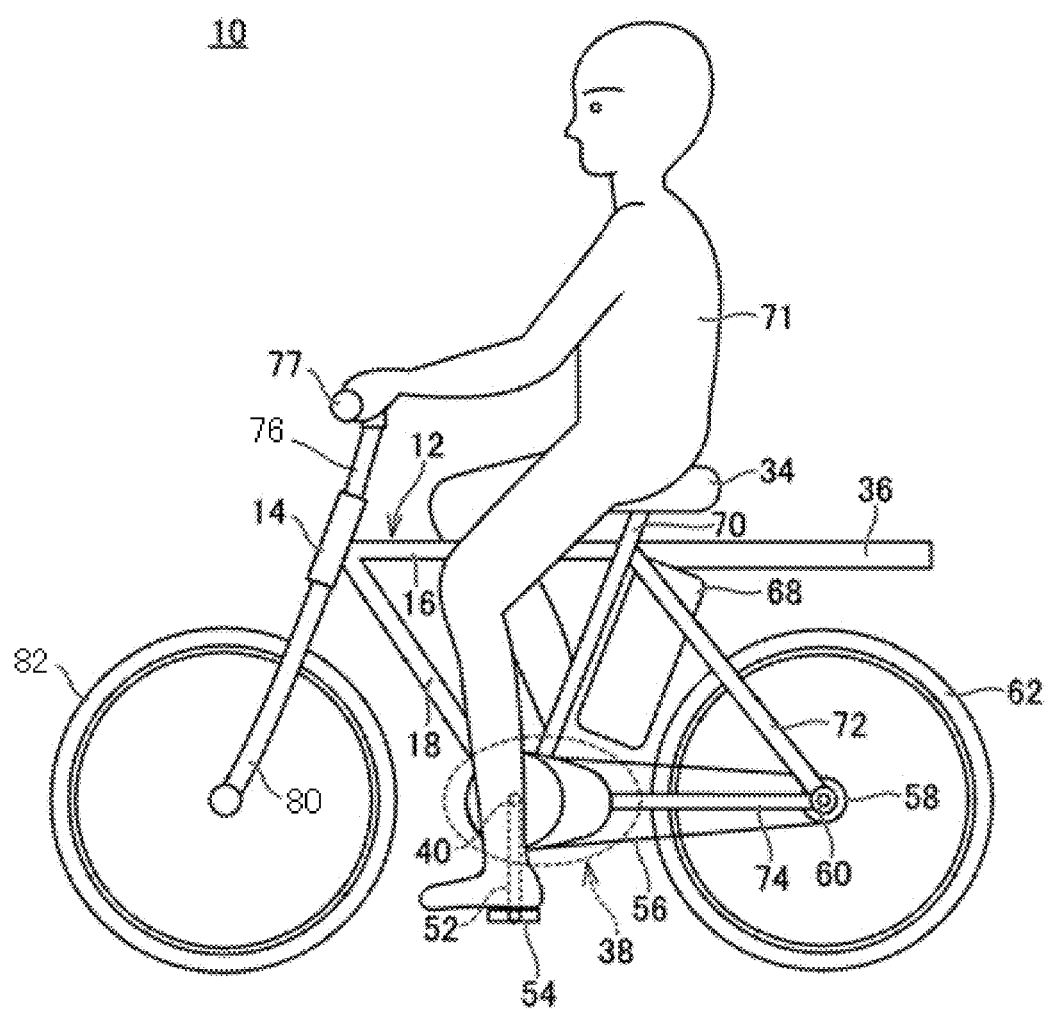
FIG. 21 schematically illustrates a configuration of an electric motor-assisted bicycle including the torque sensor illustrated in FIG. 1.

FIG. 21 schematically illustrates a configuration of the electric motor-assisted bicycle 10 as an example of an electrically assisted vehicle according to the present invention. In FIG. 21, left and right, front and rear, and top and bottom are based on a state in which an occupant 71 sits on a saddle 34 of the electric motor-assisted bicycle 10, facing the handle bar 77 thereof.

As illustrated in FIG. 21, the electric motor-assisted bicycle 10 includes a frame 12. The frame 12 includes a head pipe 14, an upper pipe 16, a front pipe 18, a seat pipe 70, a pair of rear pipes 72, and a pair of lower pipes 74. The upper pipe 16 extends from the head pipe 14 rearward and horizontally. The front pipe 18 extends from the head pipe 14 rearward and obliquely downward. The seat pipe 70 connects the rear end of the upper pipe 16 to the rear end of the front pipe 18. The pair of rear pipes 72 extends from the connecting point between the upper pipe 16 and the seat pipe 70 rearward and obliquely downward. The pair of lower pipes 74 extends from the connecting point between the front pipe 18 and the seat pipe 70 rearward and horizontally. The rear ends of the pair of rear pipes 72 are connected to the rear ends of the pair of lower pipes 74.

In the head pipe 14, a steering shaft 76 for changing the travelling direction of the vehicle is disposed along the head pipe 14. The steering shaft 76 is rotatable in the head pipe 14. The handle bar 77 is attached to the upper end of the steering shaft 76. A pair of left and right front forks 80 is attached to the lower end of the steering shaft 76. A front wheel 82 is attached to the lower end of the front forks 80. The front wheel 82 is rotatable about the center axis of the front wheel 82 supported by the front forks 80. The saddle 34 is disposed at the upper end of the seat pipe 70. A carrier 36 is fixed to the seat pipe 70 and extends rearward therefrom.

Figure 22:
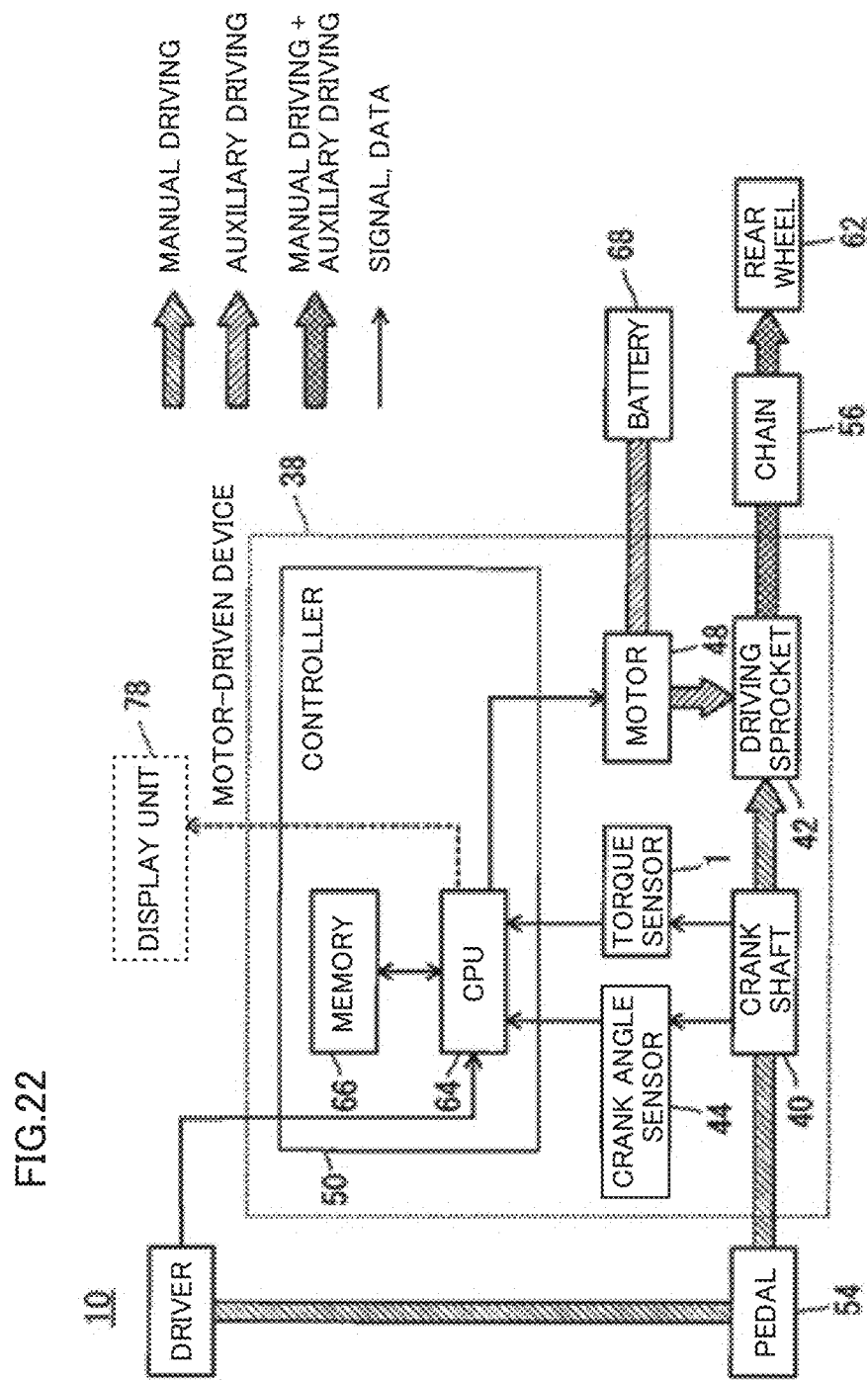
FIG. 22 is a block diagram schematically illustrating a configuration of a motor-driven device in the electric motor-assisted bicycle illustrated in FIG. 21.

A motor-driven device 38 is disposed at the connecting point between the front pipe 18 and the seat pipe 70. FIG. 22 schematically illustrates a configuration of the motor-driven device 38 of the electric motor-assisted bicycle 10. The motor-driven device 38 includes the torque sensor 1 according to the embodiment described above. More specifically, as illustrated in FIG. 22, the motor-driven device 38 includes a crank shaft 40, a driving sprocket 42, a crank angle sensor 44, the torque sensor 1, an electric motor 48, and a controller 50. The motor-driven device 38 may be configured to be attachable to a bicycle that is not an electric motor-assisted bicycle or may be configured to be interchangeable with an existing motor-driven device of an electric motor-assisted bicycle.

As illustrated in FIG. 21, the pedal 54 is attached to the crank shaft 40 through a crank 52. The driving sprocket 42 (see FIG. 22) is attached to the outer peripheral surface of the crank shaft 40. The driving sprocket 42 is connected to a rear-wheel sprocket 58 through an endless chain 56. A rear wheel 62 is attached to the rear-wheel sprocket 58 through a rotating shaft 60. The rear wheel 62 is rotatable about the rotating shaft 60.

Although not shown, the crank angle sensor 44 and the torque sensor 1 are disposed near the crank shaft 40. The crank angle sensor 44 detects a crank angle $\theta_c$ that is a rotation angle of the crank shaft 40 rotating by operation of the pedal 54. The torque sensor 1 detects a crank torque $\tau$ that is a torque applied to the crank shaft 40. The electric motor 48 generates an auxiliary driving force to be applied to the driving sprocket 42.

The controller 50 includes a CPU 64 and a memory 66. The CPU 64 performs a necessary computation and controls operations of the electric motor 48 and the electric motor-assisted bicycle 10. The memory 66 as a storage unit is constituted by, for example, an EEPROM, and stores programs and data for controlling an operation of the electric motor-assisted bicycle 10, computation data, and so forth. The memory 66 stores an assist pattern.

A battery 68 constituted by a battery (e.g., a secondary battery such as a nickel (Ni)-cadmium (Cd) battery) for supplying electric power to the electric motor 48 is attached to the seat pipe 70. The CPU 64 of the controller 50 receives the crank angle $\theta_c$ output from the crank angle sensor 44 and the crank torque $\tau$ output from the torque sensor 1. These data items are stored in the memory 66.

Based on the crank angle $\theta_c$ and the crank torque $\tau$, the CPU 64 controls an auxiliary driving force generated by the electric motor 48.

The electric motor-assisted bicycle 10 according to this embodiment includes the torque sensor 1 according to the embodiment described above that can accurately detect a torque with high sensitivity, and thus, the electric motor-assisted bicycle 10 can travel with stability.

Advantages of Embodiment

In this embodiment, the torque sensor 1 includes the tubular substrate 21 extending along the axis A and the magnetostrictive film 2 formed on the outer peripheral surface 21s of the substrate 21. The magnetostrictive film 2 includes the plurality of magnetostrictive lines 2a each extending linearly. In at least some of the plurality of magnetostrictive lines 2a, when the magnetostrictive lines 2a including the some of the magnetostrictive lines 2a are viewed in a cross section taken orthogonally to the extension direction of the magnetostrictive lines 2a, the length M of a longest portion of one of the magnetostrictive lines 2a is larger than the length N of a contact area 2f between the one of the magnetostrictive lines 2a and the outer peripheral surface 21s of the substrate 21, and is larger than the length of the interspace D between the contact area 2f and another contact area 2f, in a direction parallel to the outer peripheral surface 21s of the substrate 21, and the another contact area 2f is between one of the magnetostrictive lines 2a adjacent to the one of the magnetostrictive lines 2a and the outer peripheral surface 21s of the substrate 21 (i.e., the interspace D between adjacent ones of the magnetostrictive lines 2a).

In the configuration described above, in the cross sectional view of the magnetostrictive lines 2a taken orthogonally to the extension direction of the magnetostrictive lines 2a, the length M of the longest portion of each of the magnetostrictive lines 2a in the direction parallel to the outer peripheral surface 21s of the substrate 21 is larger than the length of the interspace D between adjacent ones of the magnetostrictive lines 2a. Thus, the interspace D between the magnetostrictive lines 2a is relatively narrow. In this configuration in which the interspace D between the adjacent magnetostrictive lines 2a is narrow, the length M of the longest portion is made larger than the length N of the contact area 2f between each magnetostrictive line 2a and the outer peripheral surface 21s of the substrate 21 so that the surface area of the magnetostrictive lines 2a can be increased. Thus, a change in magnetic permeability upon application of a force to the magnetostrictive film 2 can be easily detected. As a result, sensitivity of the torque sensor 1 can be enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the length M of the longest portion is larger than the maximum thickness H of the magnetostrictive lines 2a.

Thus, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, each of the magnetostrictive lines 2a is formed in a flat shape that is longer in the direction parallel to the outer peripheral surface 21s of the substrate 21 than in the thickness direction of the magnetostrictive line 2a. Accordingly, the surface area of the magnetostrictive lines 2a can be further increased. Thus, a change in magnetic permeability upon application of a force to the magnetostrictive film 2 can be more easily detected. As a result, sensitivity of the torque sensor 1 can be further enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the maximum thickness H of each of the magnetostrictive lines 2a is larger than the height $H_1$ in the thickness direction from the outer peripheral surface 21s of the substrate 21 to the longest portion of each of the magnetostrictive lines 2a.

Thus, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a portion wider than the contact area 2f with the outer peripheral surface 21s of the substrate 21 can be formed. Accordingly, the surface area of the magnetostrictive lines can be increased, as compared to magnetostrictive lines not having a portion wider than the contact area 2f with the outer peripheral surface 21s of the substrate 21. Thus, a change in magnetic permeability upon application of a force to the magnetostrictive film 2 can be easily detected. As a result, sensitivity of the torque sensor 1 can be further enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a half of the maximum thickness H of the magnetostrictive lines 2a is greater than or equal to the height $H_1$ in the thickness direction from the outer peripheral surface 21s of the substrate 21 to the longest portion of each of the magnetostrictive lines 2a.

In this manner, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a portion longest in the direction parallel to the outer peripheral surface 21s of the substrate 21 can be formed in a wider range in the thickness direction of the magnetostrictive lines 2a. Accordingly, the surface area of the magnetostrictive lines can be further increased. Thus, a change in magnetic permeability upon application of a force to the magnetostrictive film 2 can be more easily detected.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the length of the interspace D from the contact area 2f of one of the magnetostrictive lines 2a and the contact area 2f between one of the magnetostrictive lines 2a adjacent to the one of the magnetostrictive lines 2a and the outer peripheral surface 21s of the substrate 21 is larger than the sum of the length of the longest portion projecting from the contact area 2f toward the adjacent magnetostrictive line 2a and the length of the longest portion of the adjacent magnetostrictive line 2a from the contact area 2f between the adjacent magnetostrictive line 2a and the substrate 21 toward the one of the magnetostrictive lines 2a, in the direction parallel to the outer peripheral surface 21s of the substrate 21.

In this manner, in adjacent magnetostrictive lines 2a, contact between the longest portions can be prevented.

The magnetostrictive film 2 includes the connecting parts 26 connecting the plurality of magnetostrictive lines 2a. With this configuration, the magnetostrictive lines 2a are not easily separated from the substrate 21. Thus, strength of the magnetostrictive film 2 can be enhanced.

The torque sensor 1 further includes the coils 3 and 4 disposed to surround the magnetostrictive film 2. Accordingly, a change in magnetic permeability occurring in the magnetostrictive film 2 can be detected based on a change in impedance of the coils 3 and 4.

The plurality of coils 3 and 4 are arranged side by side along the axis A. The plurality of coils 3 and 4 ensure detection of a change in magnetic permeability of the magnetostrictive film 2. Accordingly, detection accuracy of the torque sensor 1 can be enhanced.

Other Embodiments

The embodiment of the present invention has been described above, but the embodiment is merely an example for carrying out the invention. Thus, the invention is not limited to the embodiment, and the embodiment may be modified as necessary within a range not departing from the gist of the invention.

In the embodiment, the configuration of the embodiment is applied to the torque sensor 1 as an example of the magnetostrictive sensor. The configuration of this embodiment, however, may be applied to other sensors such as a load sensor as long as the sensor includes a magnetostrictive film. Similarly, the configuration of the embodiment may be applied not only to a torque sensor for use in an electric motor-assisted bicycle but also sensors for other purposes.

In the embodiment, the substrate 21 is cylindrical. The substrate 21, however, may have any cross-sectional shape as long as the substrate 21 is tubular or columnar.

In the embodiment, the magnetostrictive lines 2a of the magnetostrictive film 2 extend in lines. However, at least a part of the plurality of island-shape magnetostrictive portion may be connected together in lines. The plurality of magnetostrictive lines 2a may not be parallel to one another as long as the magnetostrictive lines 2a are not in contact with one another.

In the embodiment, the plurality of magnetostrictive lines 2a of the magnetostrictive film 2 have the same cross section as that illustrated in FIG. 14 across the extension direction thereof. However, the cross sections of the magnetostrictive lines 2a may differ from one another in each of the magnetostrictive lines 2a in the extension direction thereof. All the plurality of magnetostrictive lines 2a do not need to have the same cross-sectional shape.

In the embodiment, in the cross section taken orthogonally to the extension direction of the magnetostrictive lines 2a, the magnetostrictive lines 2a have the projections 2e projecting to opposite directions parallel to the outer peripheral surface 21s of the substrate 21. The magnetostrictive lines 2a, however, may have projections projecting in one direction parallel to the outer peripheral surface 21s of the substrate 21.

In this embodiment, in the cross section of the magnetostrictive lines 2a taken orthogonally to the extension direction thereof, the length M of the longest portion in the direction parallel to the outer peripheral surface 21s of the substrate 21 is larger than the maximum thickness H of the magnetostrictive lines 2a. In the magnetostrictive lines 2a, however, the length M of the longest portion may be less than or equal to the maximum thickness H.

In the embodiment, in the cross section of the magnetostrictive lines 2a taken orthogonally to the extension direction thereof, a half of the maximum thickness H of the magnetostrictive lines 2a is greater than or equal to the height $H_1$ in the thickness direction from the outer peripheral surface 21s of the substrate 21 to the longest portion of each of the magnetostrictive lines 2a. In the magnetostrictive lines 2a, however, the half of the maximum thickness H may be smaller than the height $H_1$.

EXAMPLES

Examples of the present invention will now be described, but the invention is not limited to the examples below.

First Example

With the fabrication method illustrated in FIG. 16, the magnetic structure 20 including the magnetostrictive film 2 having the magnetostrictive lines 2a illustrated in FIG. 3 and the cross section illustrated in FIG. 14 and formed by plating was obtained. The plating was performed with a known Ni—Fe alloy bath (Watts bath) using nickel sulfate, nickel chloride, iron sulfate (II), boric acid, or the like. Plating conditions were pH3, a bath temperature of 55° C., and a current density of 5 to 20 A/dm². The plating was performed with the substrate 21 being circumferentially rotated at 3 rpm, and thereby a uniform thickness of the resulting plating film (magnetostrictive film 2) was obtained. The obtained magnetostrictive film 2 was subjected to a heat treatment at 500° C. for one hour under a nitrogen atmosphere.

Figure 23:
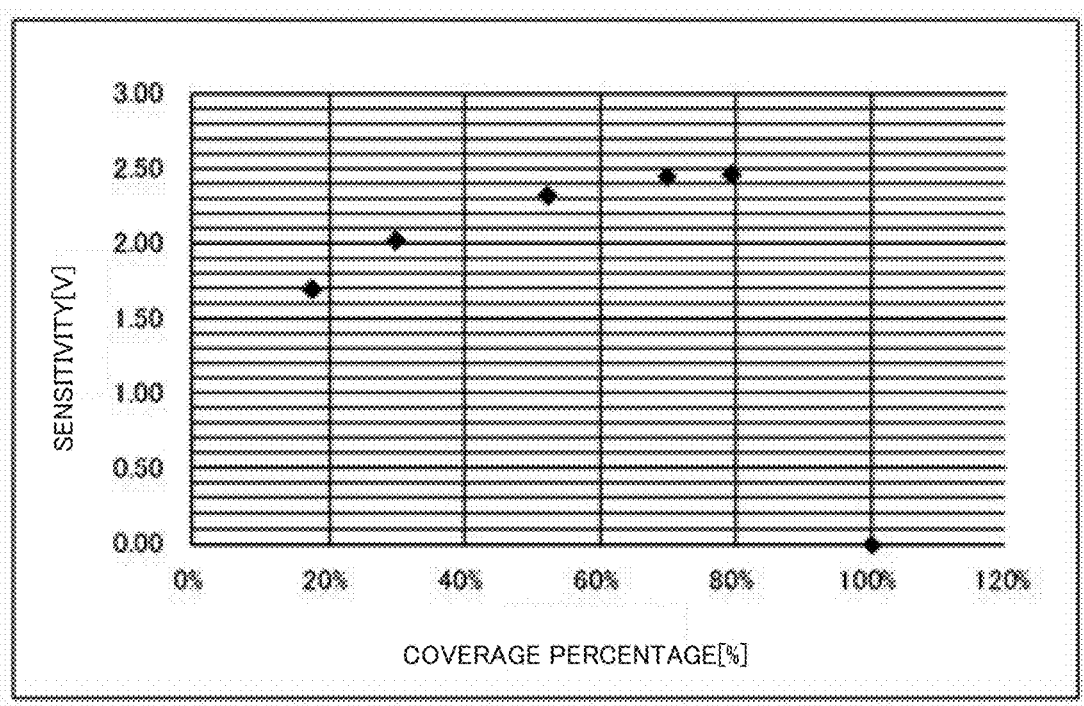
FIG. 23 is a graph showing a relationship, in a torque sensor according to an example of the present invention, between a coverage percentage of a magnetic structure (abscissa) and sensitivity of the torque sensor (ordinate).
Figure 24:
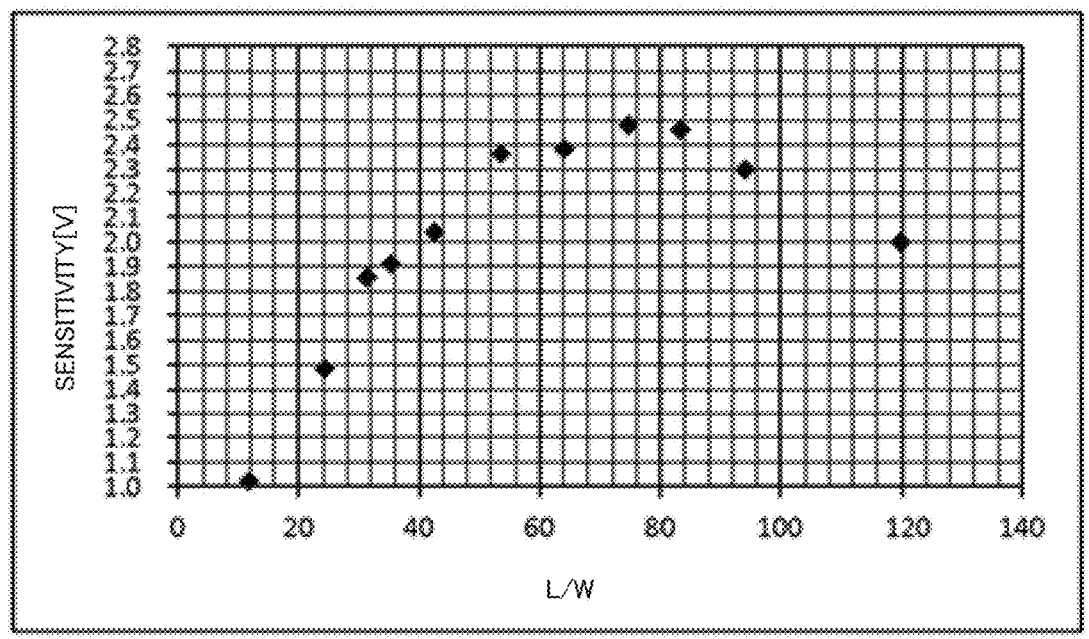
FIG. 24 is a graph showing a relationship, in a torque sensor according to an example of the present invention, between a ratio of length L/width W of a magnetostrictive line of a magnetic structure (abscissa) and sensitivity of the torque sensor (ordinate).

In the magnetic structure 20 obtained by the method described above, the magnetostrictive lines 2a in cross section (FIG. 14) had a maximum thickness H of 85 μm, a width M of 460 μm, a length N in an interface with the substrate 21 of 260 μm, a coverage percentage of 17%, 30%, 52%, 70%, or 79% (FIG. 23), a length L/width W of the magnetostrictive lines 2a of 12, 25, 32, 36, 43, 54, 64, 75, 84, 95, or 120 (FIG. 24). In the magnetostrictive lines 2a, the angle $\theta_1$ formed by the first direction and the second direction (see FIG. 3) was 90°. As illustrated in FIG. 3, the angle $\theta_1$ formed by the axis A of the substrate 21 and the first direction was 45°. As illustrated in FIG. 3, the angle $\theta_2$ formed by the axis A of the substrate 21 and the second direction was 45°. The interspace I between adjacent magnetostrictive lines 2a was 200 μm. The resist layer 91 used for fabricating the magnetostrictive film 2 had a thickness of 20 μm.

The obtained magnetostrictive film 2 was a Fe—Ni alloy. The magnetostrictive film 2 had a Fe concentration of 30 mass % and a Ni concentration of 70 mass %. A material for the substrate 21 was SCM435 (JIS G4053). Using the magnetic structure 20 obtained in this example, the torque sensor 1 having the configuration illustrated in FIG. 1 was fabricated.

The sensitivity of the torque sensor 1 was measured by connecting the torque sensor 1 to the circuit illustrated in FIG. 20 and applying a torque of 80 Nm. In the circuit, each of a resistor R1 and a resistor R2 was a resistor having a resistance value of 15Ω. Each of coils C1 and C2 was configured by winding, 124 times, a copper wire having a diameter of 0.2 mm and provided with an insulating coating.

FIG. 23 is a graph showing a relationship between a coverage percentage of the magnetic structure 20 (abscissa) and sensitivity of the torque sensor 1 (ordinate) in the torque sensor 1 according to this example. From FIG. 23, it can be understood that excellent sensitivity can be obtained with a coverage percentage of 30% or more and 95% or less.

FIG. 24 is a graph showing a relationship between the length L/width W of the magnetostrictive line 2a of a magnetic structure 20 (abscissa) and sensitivity of the torque sensor 1 (ordinate) in the torque sensor 1 according to this example (coverage percentage: 70%). From FIG. 24, it can be understood that sensitivity significantly decreases if the length L/width W is less than 30.

Figure 25:
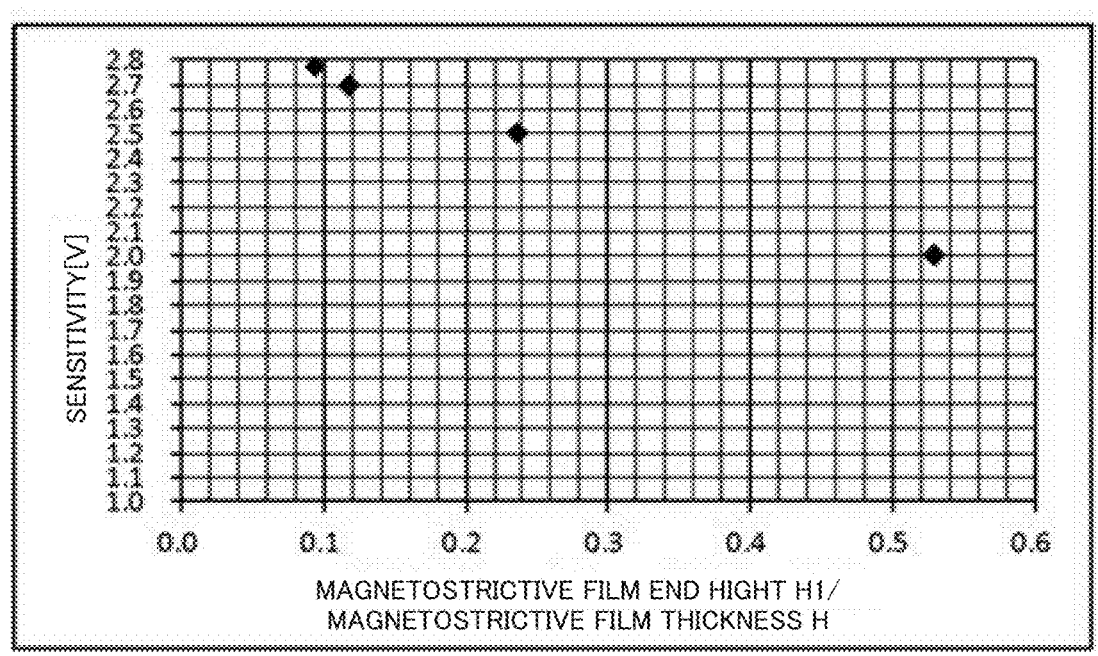
FIG. 25 is a graph showing a relationship, in a torque sensor according to an example of the present invention, between a ratio of height $H_1$ of an end of a magnetostrictive film/maximum thickness H of the magnetostrictive film in a magnetic structure (abscissa) and sensitivity of the torque sensor (ordinate).

FIG. 25 is a graph showing a relationship between the height $H_1$ of an end of the magnetostrictive film 2/the maximum thickness H of the magnetostrictive film 2 in the magnetic structure 20 (abscissa) and the sensitivity of the torque sensor 1 (ordinate) in the torque sensor 1 according to this example. Here, the maximum thickness H of the magnetostrictive film 2 was 85 μm and the thickness of the resist layer 91 was changed in the range from 3 to 45 μm. In this manner, a plurality of torque sensors 1 having different heights $H_1$ of ends of magnetostrictive films 2 and different angles $\theta_e$ (specifically, where ratios $H_1/H$ were 0.09 (angle $\theta_e$:2°), 0.12 (angle $\theta_e$:3°), 0.24 (angle $\theta_e$:5°), and 0.53 (angle $\theta_e$:15°)) were fabricated. From FIG. 25, it can be understood that as the ratio $H_1/H$ decreases, sensitivity of the torque sensor 1 increases.

Second Example

Magnetic structures having the magnetostrictive lines illustrated in FIGS. 5 through 11 and 13 and the cross section illustrated in FIG. 14 were obtained in the same manner as that of the first example, except that the magnetostrictive films 2 had patterns illustrated in FIGS. 5 through 11 and 13. The torque sensors including the magnetic structures according to this example had sensitivities substantially equal to those of the torque sensors 1 according to the first example.

Third Example

A magnetic structure having the magnetostrictive lines illustrated in FIG. 12 and the cross section illustrated in FIG. 14 was obtained in the same manner as that of the first example, except that the magnetostrictive films 2 had the pattern illustrated in FIG. 12. The torque sensor including the magnetic structure according to this example shows sensitivity slightly inferior to that of the torque sensor 1 according to the first example but shows high sensitivity.

Fourth Example

A magnetic structure having the magnetostrictive lines 2a illustrated in FIG. 3 and the cross section illustrated in FIG. 15 was obtained in the same manner as that of the first example, except that the resist layer 91 for forming the magnetostrictive film 2 had a thickness of 50 μm and the magnetostrictive film 2 had a thickness of 45 μm. The torque sensor including the magnetic structure according to this example had a sensitivity that is about ⅓ of that of the torque sensor 1 according to the first example.

INDUSTRIAL APPLICABILITY

The present invention is applicable to, for example, a magnetostrictive sensor for use in an electric motor-assisted bicycle.

The invention claimed is:

1. A magnetostrictive sensor, comprising:
a tubular or columnar substrate extending along an axis; and
a magnetostrictive portion disposed on an outer peripheral surface of the substrate, and including a plurality of magnetostrictive lines, wherein
the plurality of magnetostrictive lines include adjacent first and second magnetostrictive lines that extend along an extension direction and are disposed on the outer peripheral surface of the substrate via respectively first and second contact areas, and
in a cross sectional view of the magnetostrictive lines taken orthogonally to the extension direction,
a first length, which is a width of a widest portion of the first magnetostrictive line in a width direction parallel to the outer peripheral surface of the substrate, is larger
than a second length, which is a width of the first contact area in the width direction, and
than a third length, which is a shortest distance between the first and second contact areas in the width direction.

2. The magnetostrictive sensor of claim 1, wherein in the cross sectional view of the magnetostrictive portion, the first length is larger than a height of the first magnetostrictive line, in a height direction perpendicular to the outer peripheral surface of the substrate.

3. The magnetostrictive sensor of claim 1, wherein in the cross sectional view of the magnetostrictive portion, a height of the first magnetostrictive line, in a height direction perpendicular to the outer peripheral surface of the substrate, is larger than a first distance between the widest portion of the first magnetostrictive line and the outer peripheral surface of the substrate in the height direction.

4. The magnetostrictive sensor of claim 3, wherein in the cross sectional view of the magnetostrictive portion, a half of the height of the first magnetostrictive line is greater than or equal to the first distance.

5. The magnetostrictive sensor of claim 1, wherein in the cross sectional view of the magnetostrictive portion, a shortest distance between the first and second magnetostrictive lines in the second direction, between any portions thereof, is larger than zero.

6. The magnetostrictive sensor of claim 1, wherein the magnetostrictive portion includes a connecting part connecting the plurality of magnetostrictive lines.

7. The magnetostrictive sensor of claim 1, further comprising a coil disposed to surround the magnetostrictive portion.

8. The magnetostrictive sensor of claim 7, wherein the coil comprises a plurality of coils arranged side by side along the axis.

9. The magnetostrictive sensor of claim 1, wherein the magnetostrictive portion contains a ferromagnetic material.

10. A motor-driven device, comprising the magnetostrictive sensor of claim 1.

11. An electric motor-assisted bicycle, comprising the magnetostrictive sensor of claim 1.

12. A magnetic structure, comprising:
a tubular or columnar substrate extending along an axis; and
a magnetostrictive portion disposed on an outer peripheral surface of the substrate, and including a plurality of magnetostrictive lines, wherein
the plurality of magnetostrictive lines include adjacent first and second magnetostrictive lines that extend along an extension direction and are disposed on the outer peripheral surface of the substrate via respectively first and second contact areas, and
in a cross sectional view of the magnetostrictive portion taken orthogonally to the extension direction,
a first length, which is a width of a widest portion of the first magnetostrictive line in a width direction parallel to the outer peripheral surface of the substrate, is larger
than a second length, which is a width of the first contact area in the width direction, and
than a third length, which is a shortest distance between the first and second contact areas in the width direction.

13. A method for fabricating the magnetic structure of claim 12, the method comprising the steps of:
forming a resist layer having a predetermined pattern on the outer peripheral surface of the substrate; and
forming the magnetostrictive portion on the outer peripheral surface of the substrate on which the resist layer is disposed.

* * * * *